US008324087B2

(12) United States Patent
Zhou et al.

(10) Patent No.: US 8,324,087 B2
(45) Date of Patent: Dec. 4, 2012

(54) SCALABLE LIGHT-INDUCED METALLIC TO SEMICONDUCTING CONVERSION OF CARBON NANOTUBES AND APPLICATIONS TO FIELD-EFFECT TRANSISTOR DEVICES

(75) Inventors: Chongwu Zhou, Arcadia, CA (US); Lewis Gomez De Arco, Los Angeles, CA (US); Akshay Kumar, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 157 days.

(21) Appl. No.: 12/728,179

(22) Filed: Mar. 19, 2010

(65) Prior Publication Data
US 2010/0240199 A1 Sep. 23, 2010

Related U.S. Application Data

(60) Provisional application No. 61/161,722, filed on Mar. 19, 2009.

(51) Int. Cl.
*H01L 21/20* (2006.01)
(52) U.S. Cl. ........................................ 438/509; 977/742
(58) Field of Classification Search .................. 438/20, 438/509, 758; 977/701, 712, 742, 843, 844
See application file for complete search history.

(56) References Cited

U.S. PATENT DOCUMENTS

| 6,333,016 B1 * | 12/2001 | Resasco et al. ............ 423/447.3 |
| 6,440,761 B1 * | 8/2002 | Choi ............................... 438/20 |
| 7,834,530 B2 * | 11/2010 | Manohara et al. ............ 313/310 |

OTHER PUBLICATIONS

Arnold et al., "Sorting carbon nanotubes by electronic structure using density differentiation," 2006, Nature Nanotechnology 1:60-65, 6 pages.
Avouris et al., "Carbon-Based Electronics," 2007, Nature Nanotechnology, 2:605-615, 11 pages.
Avouris et al., "On Nanotubes: Nanomechanics, Manipulation, and Electronic Devices," 1999, Applied Surface Science 141(304)201-209, 9 pages.
Bachilo et al., "Narrow (n,m)-Distribution of Single-Walled Carbon Nanotubes Grown Using a Solid Supported Catalyst," 2003, Journal of the American Chemical Society 125:11186-7, 2 pages.
Bachtold et al., "Logic Circuits with Carbon Nanotube Transistors," 2001, Science 294-317, 24 pages.
Bohr, "Nanotechnology Goals and Challenges for Electronic Applications," Mar. 2002, IEEE Transactions on Nanotechnology 1(1):56-62, 7 pages.
Buffa et al., "Side-Wall Functionalization of Single-Walled Carbon Nanotubes with 4-Hydroxymethylaniline Followed by Polymerization of -Caprolactone,"2005, Macromolecules 38, 8258-8263, 6 pages.
Chan et al., "Oxidation of Carbon Nanotubes by Singlet O2," Feb. 28, 2003, Physical Review Letters 90 (8):86403-1-4 (2003), 4 pages.
Chen et al., "Novel Method of Converting Metallic-Type Carbon Nanotubes to Semiconducting-Type Carbon Nanotube Field-Effect Transistors," 2006, Japanese Journal of Applied Physics 45(4B):3680-3685, 6 pages.

(Continued)

*Primary Examiner* — Brook Kebede
(74) *Attorney, Agent, or Firm* — Fish & Richardson P.C.

(57) ABSTRACT

Among others, techniques are described for forming nanotubes. In one aspect, a method includes forming a base layer of a transition metal on a substrate. The method also includes heating the substrate with the base layer in a mixture of gases to grow nanotubes on the base layer.

27 Claims, 19 Drawing Sheets

OTHER PUBLICATIONS

Chen et al., "Bulk Separative Enrichment in Metallic or Semiconducting Single-Walled Carbon Nanotubes," 2003, Nano Letters 3(9):1245-1249, 5 pages.

Chen et al., "Toward the Extraction of Single Species of Single-Walled Carbon Nanotubes Using Fluorene-Based Polymers," 2007, Nano Letters 7, 3013, 5 pages.

Chen et al., "Chemically Doped Double-Walled Carbon Nanotubes: Cylindrical Molecular Capacitors," Jun. 27, 2003, Physical Review Letters 90(25):257403-1-257403-1, 4 pages.

Collins et al., "Engineering Carbon Nanotubes and Nanotube Circuits Using Electrical Breakdown," Apr. 2001, Science 292(5517):706-709, 4 pages.

Derycke et al., "Carbon Nanotube Inter- and Intramolecular Logic Gates," 2001, Nano Letters 1(9):453-456, 4 pages.

Gomez De Arco et al., "Resonant micro-Raman spectroscopy of aligned single-walled carbon nanotubes on a-plane sapphire," received Apr. 21, 2008, accepted Aug. 17, 2008, published online Sep. 24, 2008, Applied Physics Letters 93:123112.1-3, 3 pages.

Han et al., "Template-Free Directional Growth of Single-Walled Carbon Nanotubes on a- and r-Plane Sapphire," 2005, Journal of the American Chemical Society 127:5294-5295, 2 pages.

Huang et al., "Preferential Destruction of Metallic Single-Walled Carbon Nanotubes by Laser Irradiation," 2006, J. Phys. Chem. B, 110(14):7316-7320, 5 pages.

Joselevich et al., "Vectorial Growth of Metallic and Semiconducting Single-Wall Carbon Nanotubes," 2002, Nano Letters 2(10):1137-1141, 5 pages.

Kim et al., "Raman and IR Spectroscopy of Chemically Processed Single-Walled Carbon Nanotubes," 2005, Journal of the American Chemical Society 127, 15437-15445, 9 pages.

Li et al., "Preferential Growth of Semiconducting Single-Walled Carbon Nanotubes by a Plasma Enhanced CVD Method," 2004, Nano Letters 4(2):317-321, 5 pages.

Liu et al., "Novel Nanotube-on-Insulator (NOI) Approach toward Single-Walled Carbon Nanotube Devices," 2006, Nano Letters 6(1): 34-39, 6 pages.

Mahar et al., "Development of Carbon Nanotube-Based Sensors—A Review," 2007, IEEE Sensors Journal 7(2):266-284, 19 pages.

Nish et al., "Highly selective dispersion of single-walled carbon nanotubes using aromatic polymers," 2007, Nature Nanotechnology 2:640-646, 7 pages.

Park et al., "Adsorption of Atomic Hydrogen on Single-Walled Carbon Nanotubes," 2005, Journal of Physical Chemistry B 109, 8967-8972, 6 pages.

Park et al., "Generalized Chemical Reactivity of Curved Surfaces: Carbon Nanotubes," 2003, Nano Letters 3, 1273, 5 pages.

Seo et al., "Chirality- and Diameter-Dependent Reactivity of NO2 on Carbon Nanotube Walls," 2005, Journal of the American Chemical Society 127, 15724-15729, 6 pages.

Tedetti et al., "Hydroxyl radical-induced photochemical formation of dicarboxylic acids from unsaturated fatty acid (oleic acid) in aqueous solution," 2007, Journal of Photochemistry and Photobiology A 188:135-139, 5 pages.

Thostenson et al., "Advances in The Science and Technology of Carbon Nanotubes and Their Composites: A Review," 2001, Composites Science and Technology 61:1899-1912, 14 pages.

Vijayaraghavan et al., "Metal-Semiconductor Transition in Single-Walled Carbon Nanotubes Induced by Low-Energy Electron Irradiation," 2005, Nano Letters 5:1575-1579, 5 pages.

Wang et al., "Electronically Selective Chemical Functionalization of Carbon Nanotubes: Correlation between Raman Spectral and Electrical Responses," 2005, Journal of the American Chemical Society 127(32):11460-11468, 9 pages.

Zellner, "Global Aspects of Atmospheric Chemistry," H. Baumgartel, W. Grunbein, F. Hensel, Eds., Topics in Physical Chemistry (Springer, New York, 1999), pp. 10-14, 12 pages.

Zhang et al., "Photoisomerization of a Fullerene Dimer," Feb. 2008, Journal of Physical Chemistry C 112, 2802-2804, 3 pages.

Zhang et al., "Hydrogenation and Hydrocarbonation and Etching of Single-Walled Carbon Nanotubes," 2006, Journal of the American Chemical Society 128, 6026-6027, 2 pages.

Zhang et al., "Selective Etching of Metallic Carbon Nanotubes by Gas-Phase Reaction," 2006, Science 314: 974-977, 5 pages.

Zheng et al., "Transition of Single-Walled Carbon Nanotubes from Metallic to Semiconducting in Field-Effect Transistors by Hydrogen Plasma Treatment," 2007, Nano Letters 7(6):1622-1625, 4 pages.

Zhou et al., "Structural Characterization and Diameter-Dependent Oxidative Stability of Single Wall Carbon Nanotubes Synthesized by the Catalytic Decomposition of CO," Dec. 14, 2001, Chemical Physics Letters 350:6-14, 9 pages.

* cited by examiner

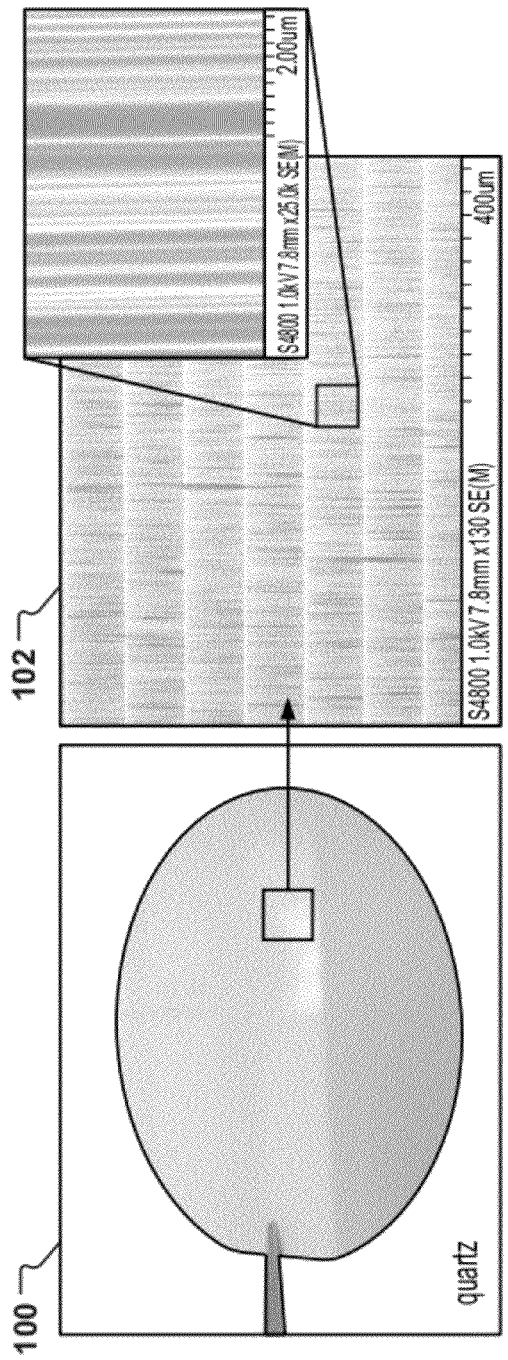
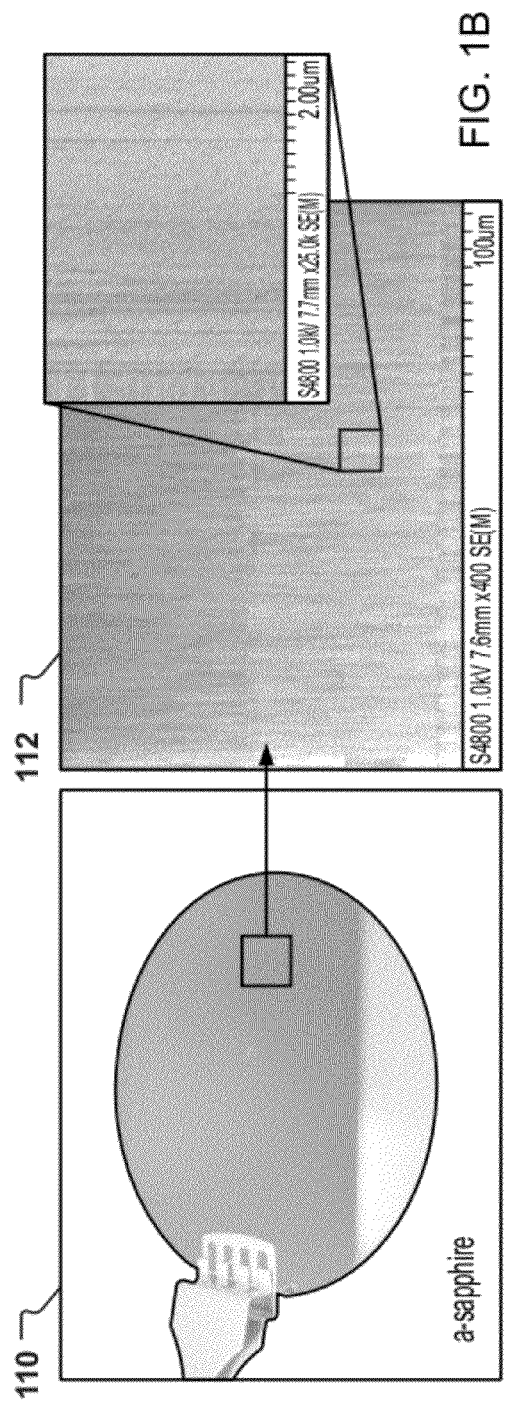
FIG. 1A
FIG. 1B

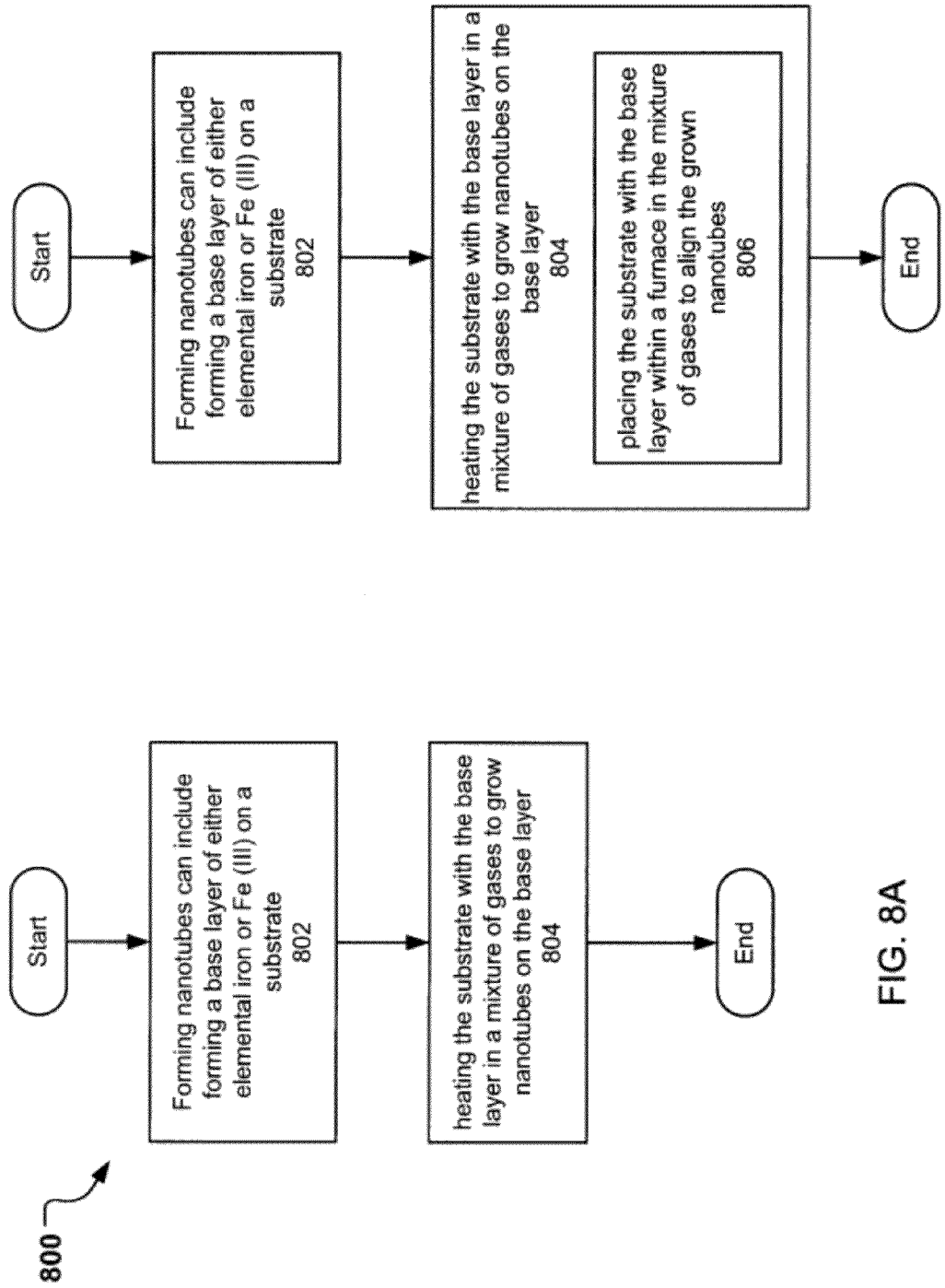

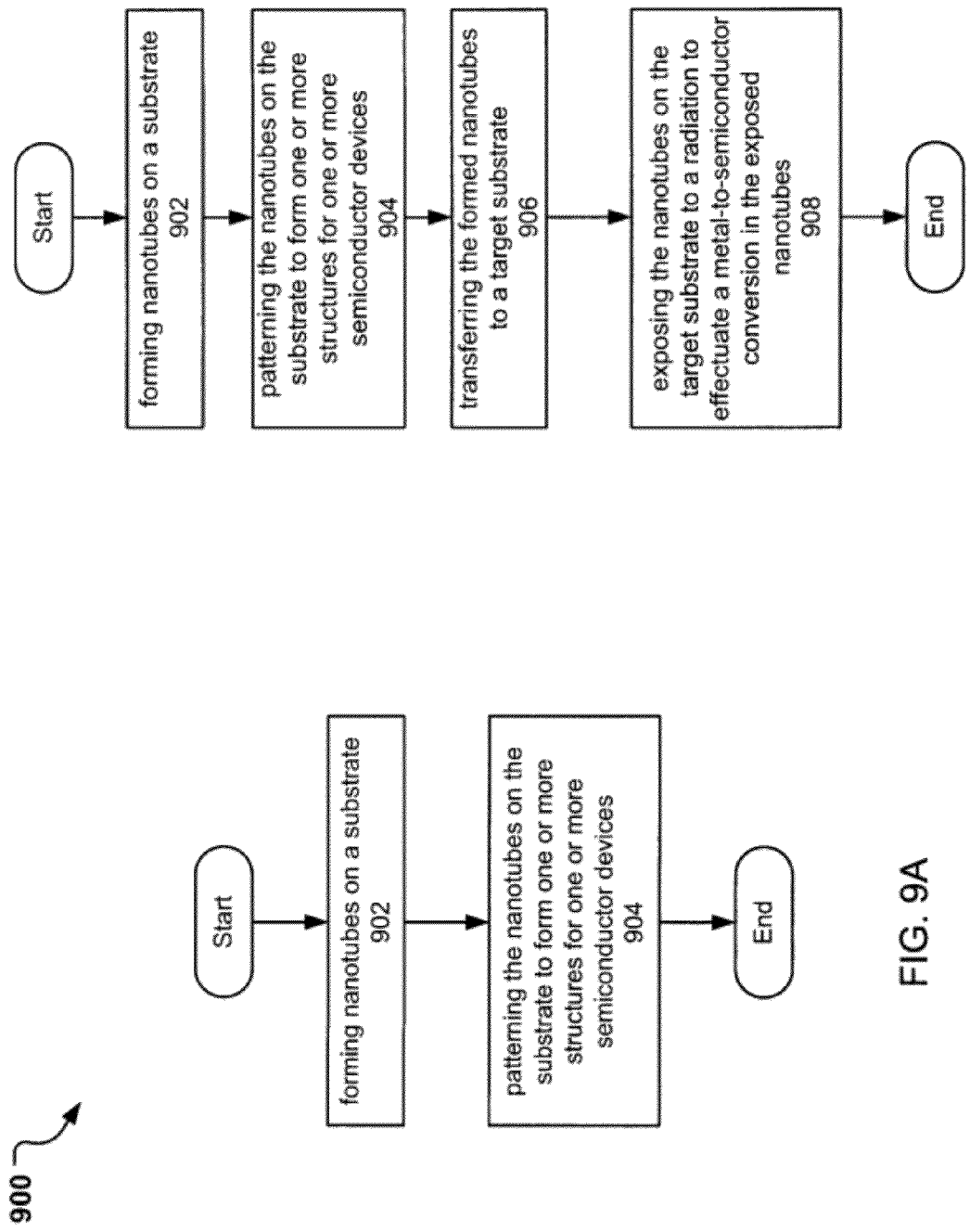

SCALABLE LIGHT-INDUCED METALLIC TO SEMICONDUCTING CONVERSION OF CARBON NANOTUBES AND APPLICATIONS TO FIELD-EFFECT TRANSISTOR DEVICES

CLAIM OF PRIORITY

This application claims priority under 35 USC §119(e) to U.S. Patent Application Ser. No. 61/161,722, filed on Mar. 19, 2009, the entire contents of which are hereby incorporated by reference.

FEDERALLY SPONSORED RESEARCH OR DEVELOPMENT

This invention was made with government support under Contract Nos. CCF0702204 and CCF0726815 awarded by the National Science Foundation. The government has certain rights in the invention.

BACKGROUND

This patent document relates to nanostructures.

Certain useful properties of single-walled carbon nanotubes (SWNTs) have earned them numerous applications in different technological areas. Carbon nanotube field-effect transistors (CNTFETs) have acquired great importance due to their capability to switch on and off much faster than current silicon technologies and the foreseen limits in the downscaling of silicon transistor. In spite of significant progress made toward integrated nanotube circuits, the assembly and integration of nanotube electronics still faces significant challenges due to the coexistence of metallic and semiconducting nanotubes in as-synthesized samples.

Different approaches can be used to obtain CNTFETs containing only semiconducting nanotubes in the channels either by selective synthesis, post-synthesis separation methods, or post-synthesis methods to selectively etch metallic nanotubes. An alternative approach is to induce a metal-to-semiconductor transition in carbon nanotubes. Electron beam irradiation and hydrogen plasma have yielded metal-to-semiconductor conversion of SWNTs, but the limited size of the electron beam and instability of the plasma represent limiting hurdles for scalability.

SUMMARY

In one aspect, a method for forming nanotubes includes forming a base layer of a transitional metal on a substrate. Additionally, the method includes heating the substrate with the base layer in a mixture of gases to grow nanotubes on the base layer.

Implementations can optionally include one or more of the following features. The transitional metal can include at least one of iron, cobalt, nickel, copper or gold. The nanotubes can include aligned nanotubes. The substrate can be made of crystal structure that promotes alignment of nanotubes. The crystal structure that promotes alignment of nanotubes can include sapphire or quartz. The mixture can include $H_2$, $CH_4$, and $C_2H_4$. Heating the substrate with the base layer can include placing the substrate with the base layer within a furnace in the mixture of gases to align the grown nanotubes. The method can include transferring the aligned nanotubes to a target substrate. Transferring the aligned nanotubes can include forming a sacrificial layer on top of the aligned nanotubes; applying an adhesive layer to attach to the sacrificial layer; lifting the adhesive layer to remove the adhesive layer, the sacrificial layer attached to the adhesive layer, and the aligned nanotubes attached to the sacrificial layer from the base layer and the underlying substrate; attaching the adhesive layer, the sacrificial layer attached to the adhesive layer, and the aligned nanotubes attached to the sacrificial layer as a whole onto the target substrate; subsequently removing the adhesive layer to leave the sacrificial layer and the aligned nanotubes attached to the sacrificial layer on the target substrate; and removing the sacrificial layer to leave the aligned nanotubes on the target substrate. The sacrificial layer can include a metal layer. The metal layer can include a gold film. The gold film can be removed by using a gold etchant to dissolve the gold film while leaving the aligned nanotubes on the target substrate. The adhesive layer can include a thermally activated adhesive polymer layer. The method can include heating the entirety of the attached adhesive layer, the sacrificial layer attached to the adhesive layer, and the aligned nanotubes attached to the sacrificial layer and the silicon-based substrate before removing the adhesive layer. The method can include processing the aligned nanotubes on the target substrate to form one or more devices on the target substrate. The target substrate can include a silicon-based substrate; and the processing can include CMOS processing. The one or more devices can include CMOS field-effect transistors. The processing can include exposing the nanotubes on the target substrate to a radiation to effectuate a metal-to-semiconductor conversion in the exposed nanotubes.

In another aspect, a method for forming a semiconductor device from nanotubes includes forming aligned nanotubes on a substrate. The method includes patterning the aligned nanotubes on the substrate to form one or more structures for one or more semiconductor devices. The method includes transferring the patterned aligned nanotubes to a target substrate; and exposing the transferred aligned nanotubes on the target substrate to a radiation to effectuate a metal-to-semiconductor conversion in the exposed nanotubes.

Implementations can optionally include one or more of the following features. The method can include forming an electrode layer over the aligned nanotubes. Forming aligned nanotubes on the substrate can include forming the aligned nanotubes on a crystal structure that promotes alignment of nanotubes. The crystal substrate structure that promotes alignment of nanotubes can include sapphire or quartz wafer. Transferring the formed aligned nanotubes to the target substrate can include transferring the formed aligned nanotubes to a silicon wafer. The radiation can include at least one of full spectrum light or ultraviolet light. Exposing the aligned nanotubes can include exposing the aligned nanotubes on the target substrate to a radiation in oxygen to effectuate a metal-to-semiconductor conversion in the exposed aligned nanotubes. Forming aligned nanotubes can include forming small-diameter aligned nanotubes having a diameter size in a range of 0.7-1.3 nm. Exposing the aligned nanotubes can include exposing the aligned nanotubes to the radiation for a period of time based on a diameter size of the nanotubes. Forming aligned nanotubes on a substrate can include forming a base layer comprising a transition metal over a substrate that promotes alignment of nanotubes; and growing aligned nanotubes over the formed base layer in presence of a gaseous mixture. The transition metal comprises at least one of iron, cobalt, nickel, copper or gold. The substrate that promotes alignment of the nanotubes comprises sapphire or quartz.

The described techniques, apparatus and systems for using light irradiation to induce the metal-to-semiconductor conversion of carbon nanotubes can potentially provide one or more of the following advantages. For example, the described techniques can use light irradiation to induce the metal-tosemiconductor conversion of carbon nanotubes for transistors based on aligned nanotubes and individual nanotube devices. The conversion process can be easy to implement and scalable to complete wafers. Additionally, the described metal-to-semiconductor conversion of carbon nanotubes can be used for fabricating field-effect transistors based on both aligned nanotubes and individual nanotube devices. The conversion process is induced by light irradiation, scalable to wafer-size scales and capable of yielding improvements in the channel-current on/off ratio up to five orders of magnitude in nanotube-based field-effect transistors. Inactivation of metallic nanotubes in the channels can be achieved as a consequence of a photochemical process that led to a controlled oxidation of the nanotube sidewall, and hence stronger localization of π-electrons. This process can be extended to other carbon nanomaterials such as graphene and can find applications beyond nanoelectronics, in any field where a clean and scalable oxidation process of carbon nanomaterials is needed.

BRIEF DESCRIPTION OF DRAWINGS

FIGS. 1A and 1B show an example of Wafer-scale synthesis of aligned nanotubes on quartz and a-sapphire wafers respectively.

FIGS. 8A, 8B, 8C, 8D, and 8E are flow charts showing an exemplary process for forming nanotubes.

FIGS. 9A and 9B are flow charts showing an exemplary process for forming a semiconductor device from nanotubes.

DETAILED DESCRIPTION

This document discloses, among others, examples for using light irradiation to induce the metal-to-semiconductor conversion of carbon nanotubes for transistors based on aligned nanotubes and individual nanotube devices. This conversion process can be easy to implement and scalable to complete wafers.

Coexistence of metallic and semiconducting carbon nanotubes in as-grown samples sets important limits to their application in high-performance electronics. The present metal-to-semiconductor conversion of carbon nanotubes can be used for fabricating field-effect transistors based on both aligned nanotubes and individual nanotube devices. The conversion process is induced by light irradiation, scalable to wafer-size scales and capable of yielding improvements in the channel-current on/off ratio up to five orders of magnitude in nanotube-based field-effect transistors. Inactivation of metallic nanotubes in the channels can be achieved as a consequence of a photochemical process that led to a controlled oxidation of the nanotube sidewall, and hence stronger localization of π-electrons. This process can be extended to other carbon nanomaterials such as graphene and can find applications beyond nanoelectronics, in any field where a clean and scalable oxidation process of carbon nanomaterials is needed.

Figure 2A:
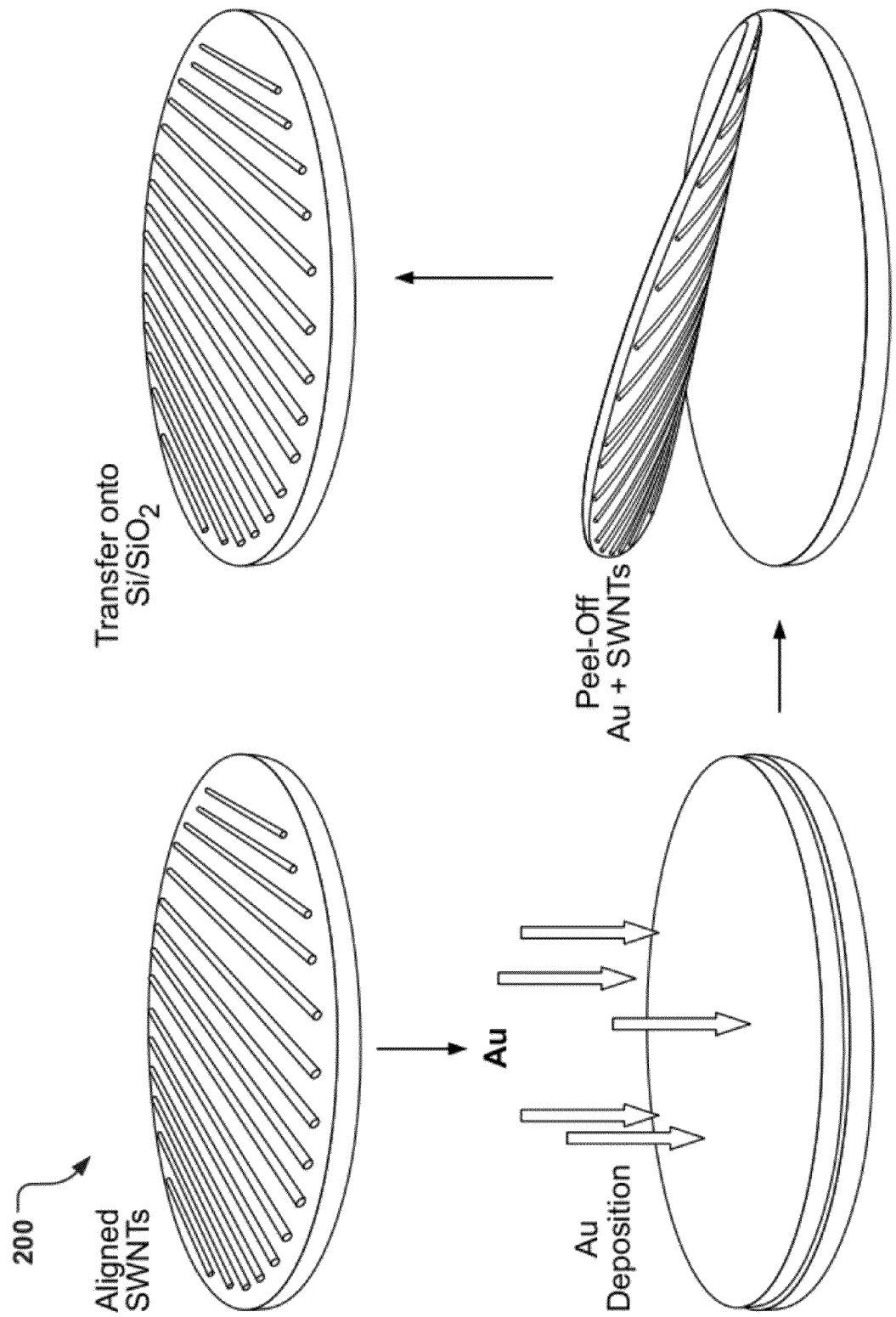
FIG. 2A is a schematic diagram 200 showing an aligned-nanotube transfer process.
Figure 2B:
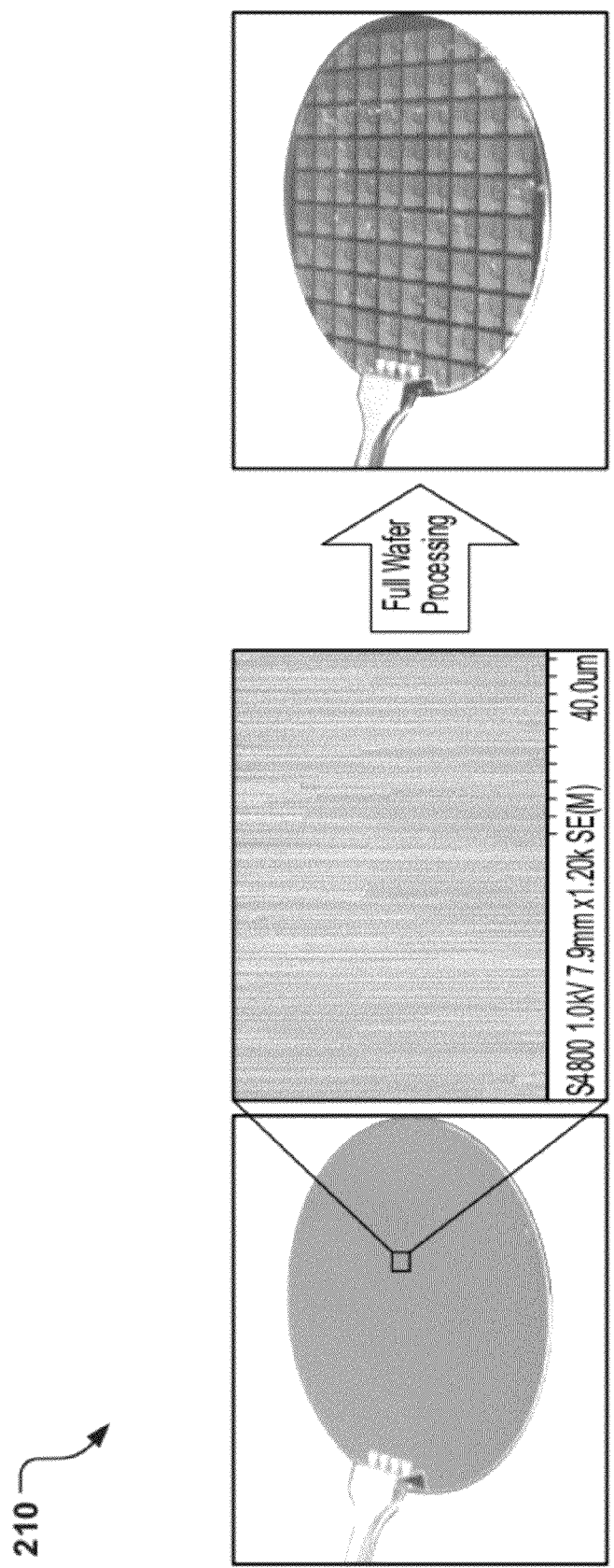
FIG. 2B includes a photograph of a Si/SiO$_2$ wafer with transferred nanotubes.

In the examples described in this document, massive aligned single-walled nanotubes are synthesized over crystalline structure that promote alignment of nanotubes, such as complete quartz and sapphire wafers (see FIGS. 1A and 1B), and then transferred to a Si/SiO$_2$ substrate for device fabrication (see FIGS. 2A and 2B). FIGS. 1A and 1B show an example of Wafer-scale synthesis of aligned nanotubes on quartz and a-sapphire wafers respectively. Photographs of the quartz and a-sapphire wafers after nanotube growth are shown on the left hand panels 100 and 110 respectively. SEM images on the right hand panels 102 and 112 show large arrays of highly aligned nanotubes.

Random orientation of as-grown carbon nanotubes on silicon substrates can become a source of obstacles for CMOS integration. Aligned SWNTs can be synthesized on quartz and sapphire wafers and transferred onto silicon wafers. A thin layer of one or more transition metal can be deposited on the crystalline structure (e.g., sapphire and quartz substrates) prior to nanotube growth. The transition metal used can include group VIII and IB metals. More specifically, elemental iron, Fe (III), cobalt, nickel, copper and gold can be used. After the deposition process, wafers can be loaded inside a horizontal quartz tube of 6 inch in diameter in a heating coil furnace. Carbon nanotube growth can be performed under a gaseous mixture of $H_2$, $CH_4$, and $C_2H_4$ at 900° C. for 30 minutes. As shown in FIGS. 1A and 1B, large arrays of horizontally aligned nanotubes with densities between 1 and 10 SWNTs/μm can be obtained at full wafer scales. FIGS. 1A and 1B show photographs of quartz and sapphire wafers after nanotube growth. SEM images in the right panels 102 and 112 show the high degree of nanotube alignment that can be obtained over full wafer scale areas on sapphire and quartz substrates.

FIG. 2A is a schematic diagram 200 showing an aligned-nanotube transfer process. FIG. 2B includes a photograph 210 of a Si/SiO$_2$ wafer with transferred nanotubes. The SEM image shows that, after being transferred, nanotubes maintain a good degree of alignment on the receiving substrate. Au electrodes deposition, followed by etching of nanotubes outside the device channel area complete the fabrication of CNT-FETs. Wafer-scale transfer of aligned nanotubes to Si/SiO$_2$ wafers brings the potential to achieve high-density two-dimensional arrays of nanotubes on silicon by repeated transfer on the same substrate, which is needed to significantly surpass the performance of current silicon-based CMOS technologies. A 100 nm film of Au can be deposited on top of the as-grown nanotubes over the entire wafers, after which a thermally activated adhesive polymer (Revalpha tape from Nitto Denko) can be placed on the Au film. Peeling-off the tape resulted in picking up the nanotube/Au film. The thermal tape/Au film/aligned SWNT film can be placed onto the target Si/SiO$_2$ substrate and the whole structure can be heated to detach the thermal tape. Gold etchant can be employed to dissolve the Au film leaving behind the aligned SWNT arrays on the target substrate. By using this approach, the transfer efficiency obtained can be nearly 100%. After nanotube transfer, photolithography can be used to fabricate back-gated carbon nanotube field-effect transistors (see FIGS. 2A and 2B).

Figure 3A:
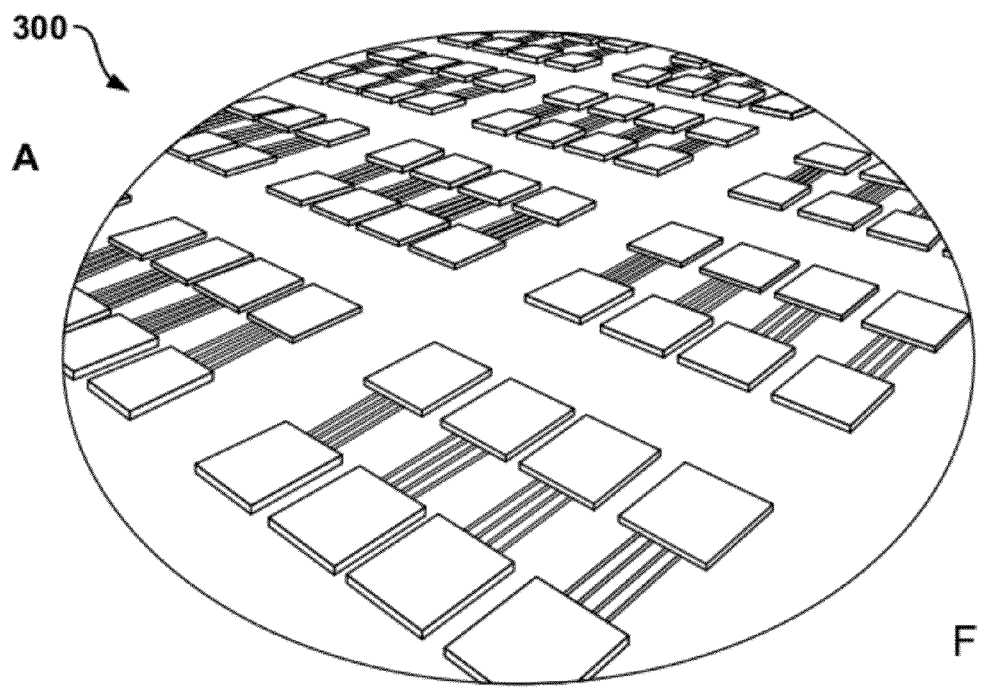
FIG. 3A is a schematic diagram showing large arrays of field-effect transistors that include horizontally aligned carbon nanotubes between source and drain electrodes.
Figure 3B:
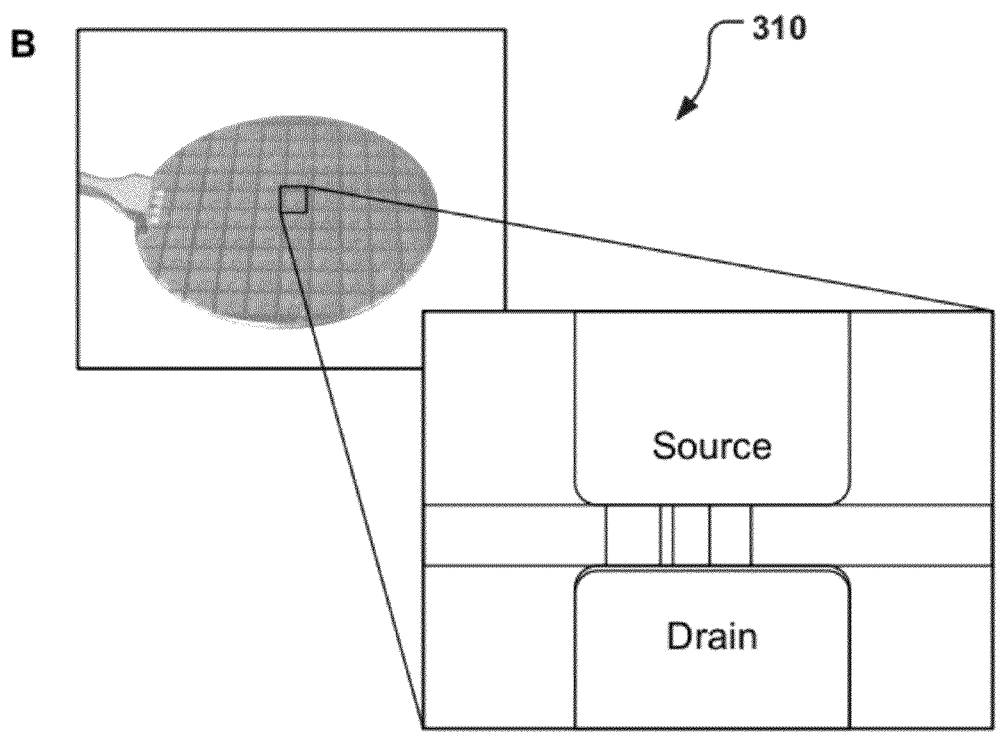
FIG. 3B shows an SEM image of an array of devices based on aligned nanotubes transferred to a 4 inch Si/SiO$_2$ wafer.
Figure 3D:
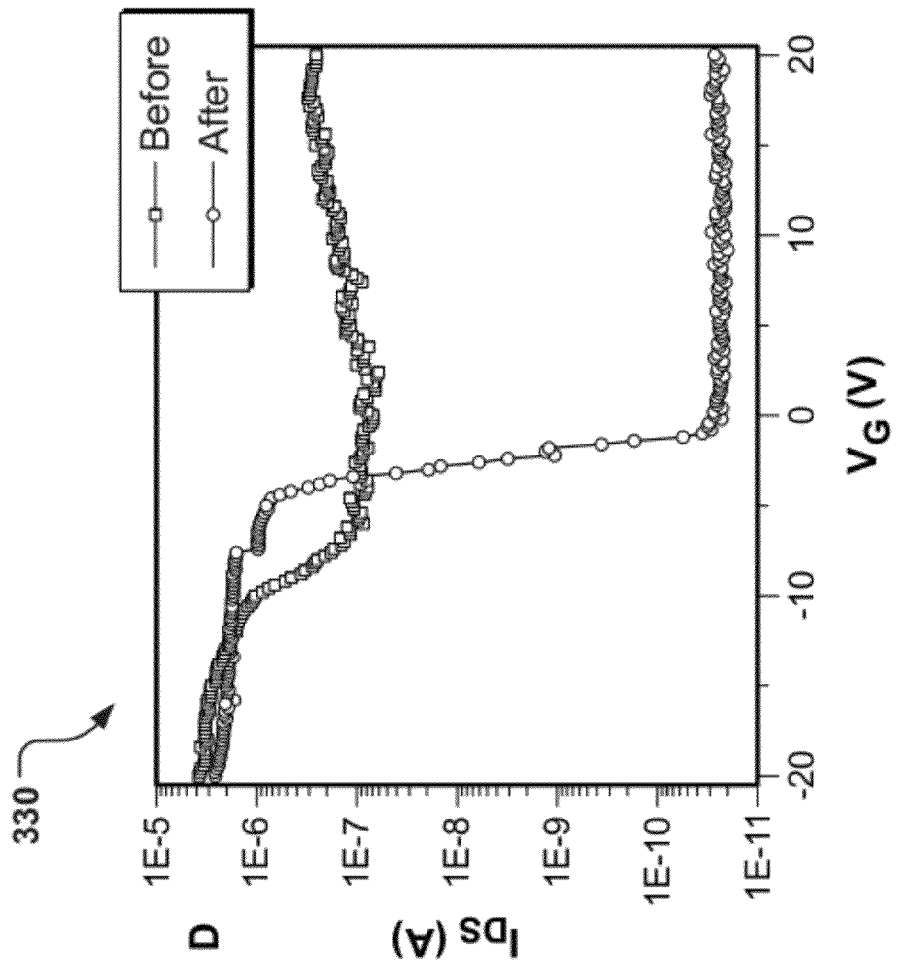
FIG. 3D is a chart 330 that shows the drain current ($I_{DS}$) v.s. gate voltage ($V_G$) for a typical device with about 6 aligned nanotubes before and after light irradiation with an accumulated energy of 30 kJ/cm$^2$.
Figure 3C:
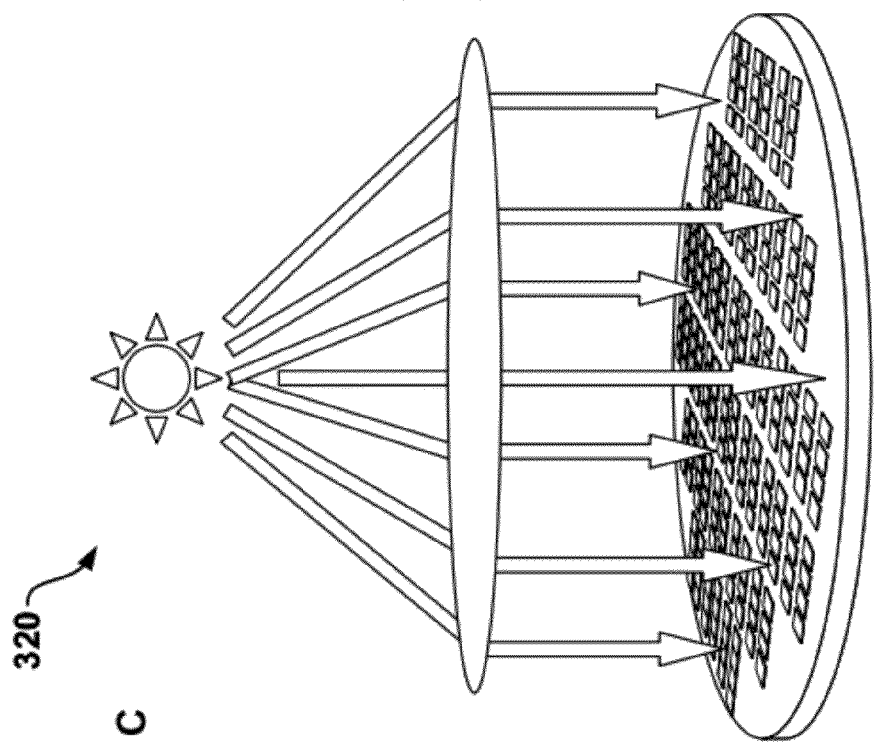
FIG. 3C is a schematic diagram showing the light irradiation process, where a collimated white light beam from either a xenon or halogen lamp is used to irradiate the fabricated wafer with nanotube devices for durations from 30 min to several hours.

These aligned nanotubes can offer significant potential for the challenging issue of nanotube assembly and integration, as nanotube devices can be easily fabricated at wafer scale, as shown in FIG. 3A. FIG. 3A is a schematic diagram 300 showing large arrays of field-effect transistors that include horizontally aligned carbon nanotubes between source and drain electrodes. FIG. 3B shows an SEM image 310 of an array of devices based on aligned nanotubes transferred to a 4 inch Si/SiO$_2$ wafer. The SEM image of a typical device is shown in FIG. 3B. FIG. 3C is a schematic diagram 320 showing the light irradiation process, where a collimated white light beam from either a xenon or halogen lamp is used to irradiate the fabricated wafer with nanotube devices for durations from 30 min to several hours. FIG. 3D is a chart 330 that shows the drain current ($I_{DS}$) v.s. gate voltage ($V_G$) for a typical device with about 6 aligned nanotubes before and after light irradiation with an accumulated energy of 30 kJ/cm$^2$. A remarkable increase in the channel current on/off ratio ($I_{On}/I_{Off}$) can be observed from 50 before irradiation to 1.2×10$^5$ after irradiation. This process is highly scalable as compared to the traditional electrical breakdown approach, which has to be carried out device by device.

Figure 4A:
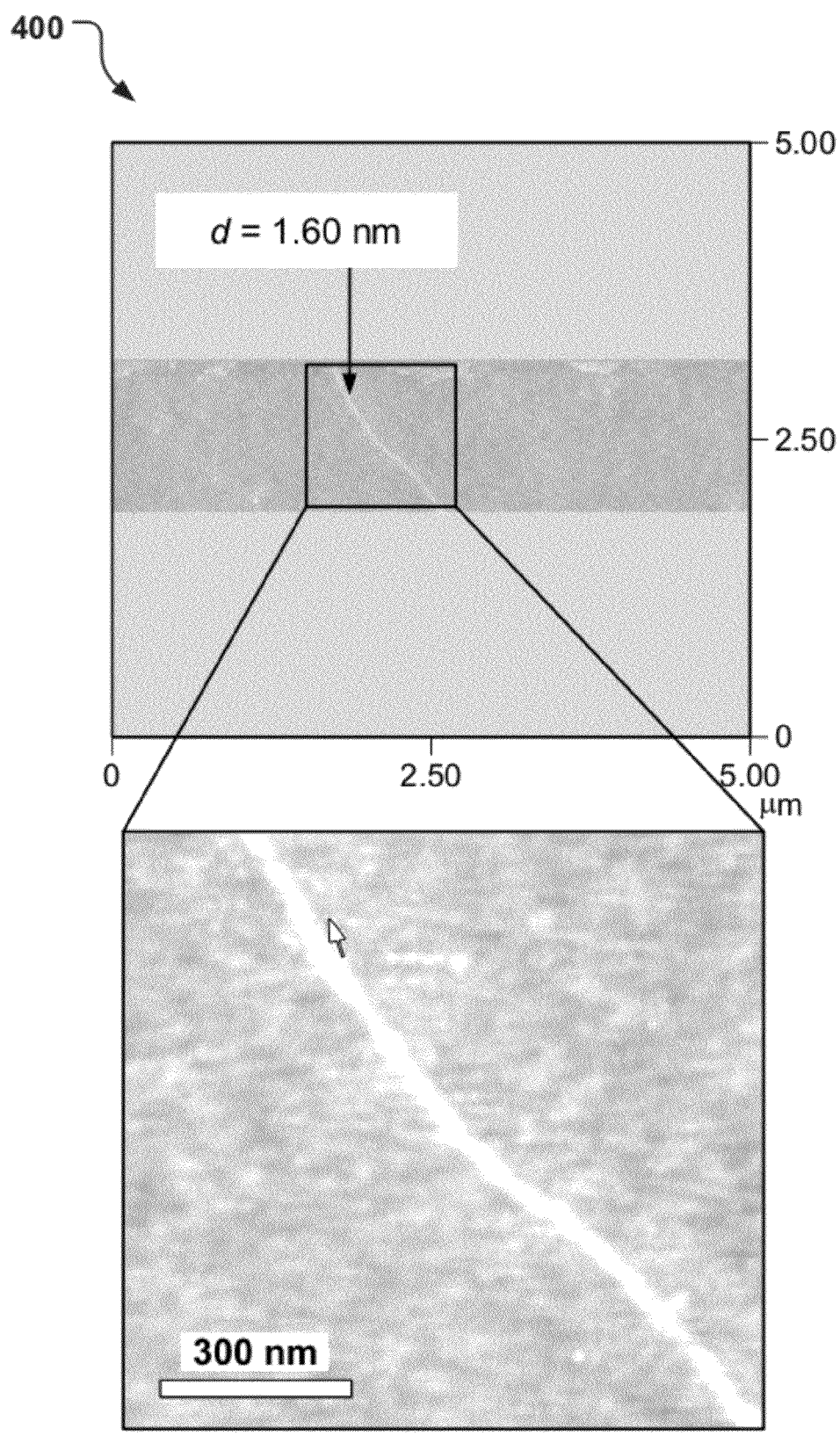
FIG. 4A is an AFM image of single-nanotube CNT-FET that shows metal-to-semiconductor transition after 5 hours of light exposure.
Figure 4B:
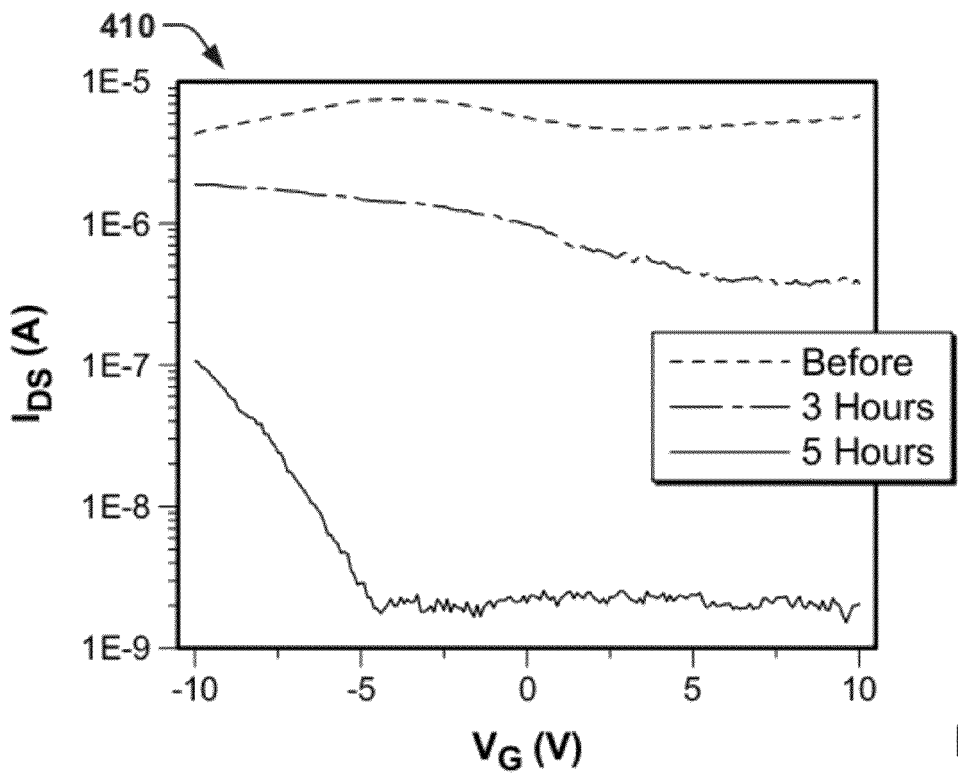
FIGS. 4B and 4C show $I_{On}/I_{Off}$ evolution of the CNT-FET shown in FIG. 4A upon timed light irradiation.
Figure 4C:
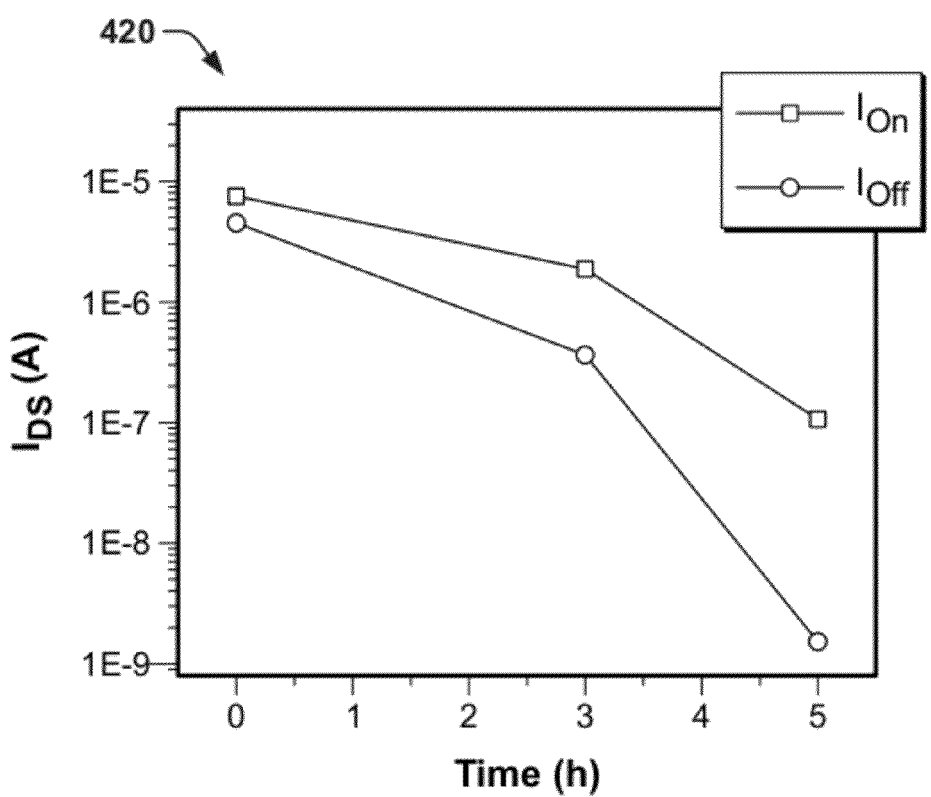

Inspection of the nanotubes after irradiation revealed no visible cut in the nanotubes (see FIGS. 4A, 4B and 4C), suggesting the increase in $I_{On}/I_{Off}$ is due to metal-to-semiconductor conversion of nanotubes in the channel. FIG. 4A is an AFM image 400 of single-nanotube CNT-FET that shows metal-to-semiconductor transition after 5 hours of light exposure. Zoomed AFM image shows no visible damage or cutting on the nanotube structure. FIGS. 4B and 4C show $I_{On}/I_{Off}$ evolution of the CNT-FET shown in FIG. 4A upon timed light irradiation. The AFM image in FIG. 4A reveals that the metal tube did not show any cutting, and the observed increase in $I_{On}/I_{Off}$ can be attributed to metal-to-semiconductor conversion. As shown in FIGS. 4B and 4C, a clear drop in $I_{On}$ and increase in gate bias dependence are observed as evidence of metal-to-semiconductor conversion associated with a higher defect density on the photo-oxidized nanotube.

Figure 5A:
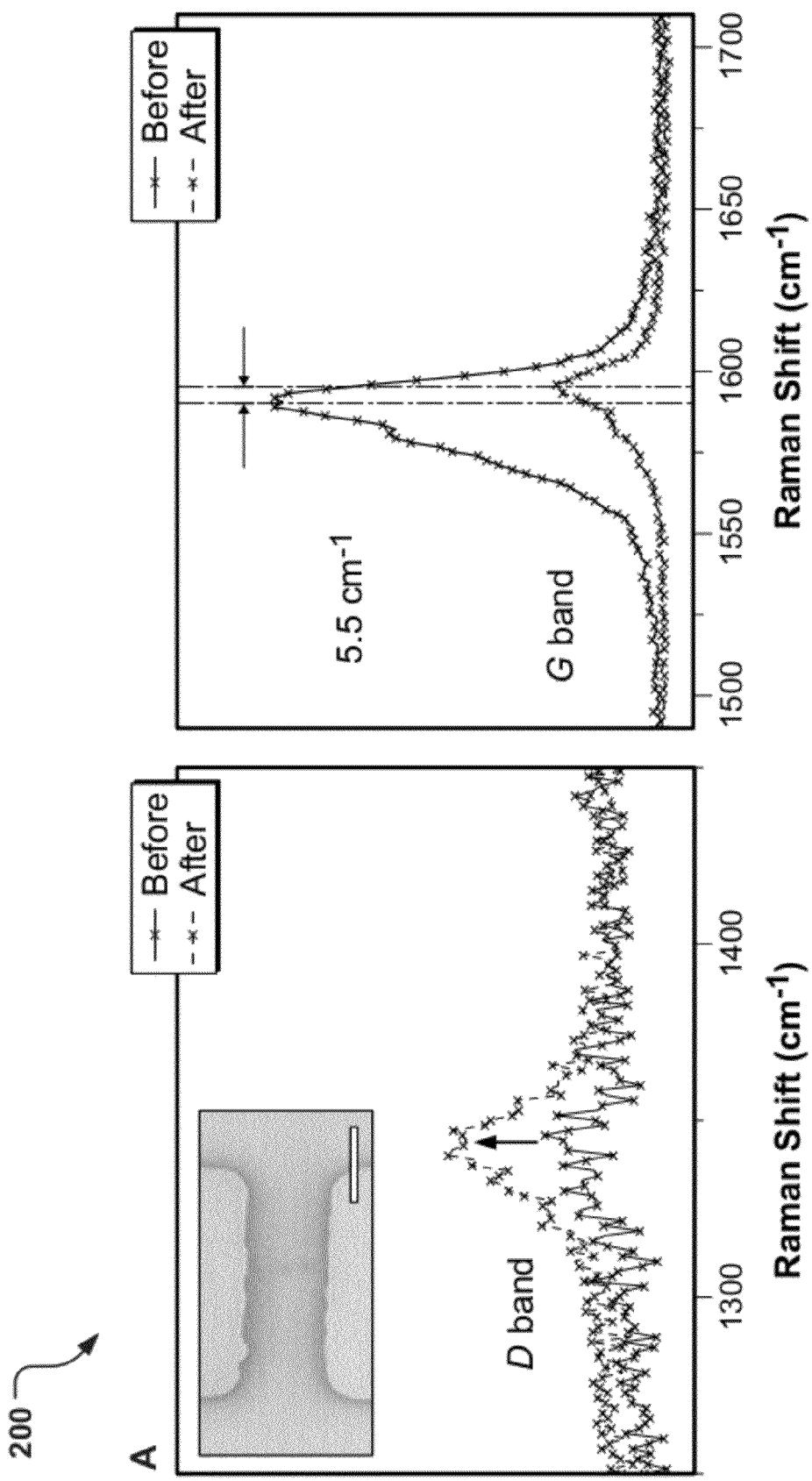
FIG. 5A show the Raman D-band, G-band of a metallic nanotube in a single-nanotube device before and after light irradiation.
Figure 5B:
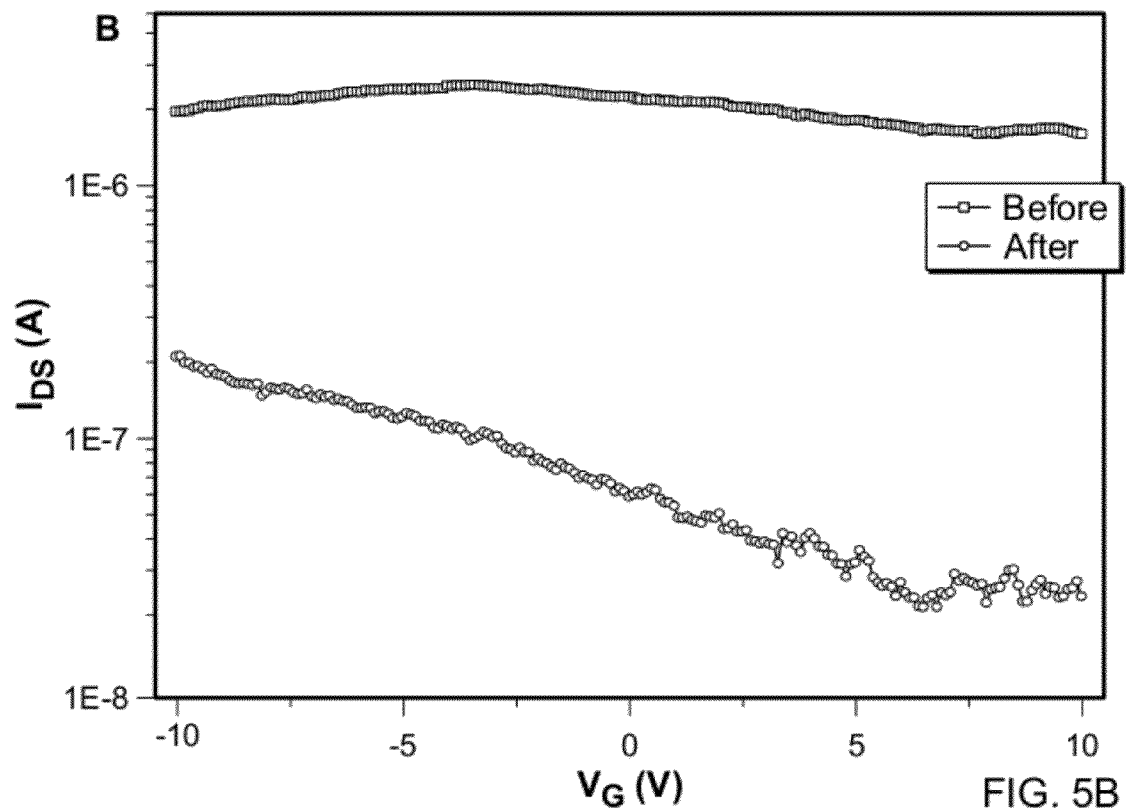
FIG. 5B shows $I_{DS}$-$V_G$ curves for a device with a single metallic nanotube before and after light irradiation.

The effect of light irradiation can be obtained from in-depth electrical measurements and micro Raman characterization for nearly 200 devices with one to five nanotubes in the channel, for example. FIG. 5A show the Raman D-band, G-band of a metallic nanotube in a single-nanotube device before and after light irradiation. A 5-fold decrease in the $I_G/I_D$ ratio shows that increased defect density on the nanotube sidewalls was achieved due to light irradiation. FIG. 5B shows $I_{DS}$-$V_G$ curves for a device with a single metallic nanotube before and after light irradiation. The $I_{On}/I_{Off}$ improved from 1.6 to 10.5, indicating a metal to semiconductor transition. Analysis of the Raman spectra of this nanotube before and after irradiation reveals an increase of the Raman band intensity at 1345 cm$^{-1}$ (D band) and a decrease of the G band intensity (1590.4 cm$^{-1}$), accompanied by an upshift of 5.5 cm$^{-1}$ for the G band The ratio between the G and D Raman band intensities ($I_G/I_D$) is regarded as an assessment of the sp$^2$/sp$^3$ ratio in carbon nanotubes, and thus the five-fold decrease in $I_G/I_D$ after irradiation (FIG. 5A) is attributed to an increase in the defect density due to an increase in the sp$^3$ nature of irradiated nanotubes. It is known that rehybridization defects due to conversion of sp$^2$ to sp$^3$ sites lead to π-electrons localization that can readily open or increase the bandgap of nanotubes, and result in the conversion of metallic to semiconductor nanotubes. The $I_{DS}$-$V_G$ curves of FIG. 5B shows that the metallic single-nanotube FET exhibited stronger gate bias dependence after light irradiation, thus indicating that an increase in the sp$^3$ nature of metallic nanotubes leads to opening of energy gaps in their band structures.

Figure 5C:
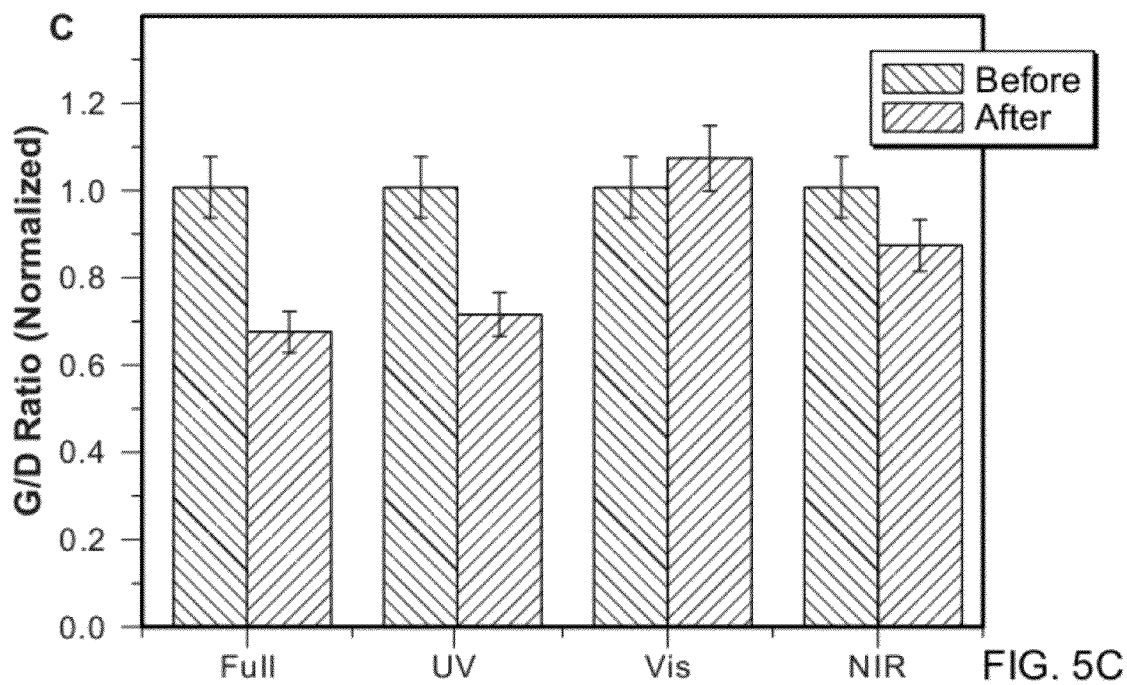
FIG. 5C displays the Raman $I_G/I_D$ before (gray bars) and after (red bars) light exposure using the full spectrum, ultraviolet, visible and near infrared irradiation.
Figure 5D:
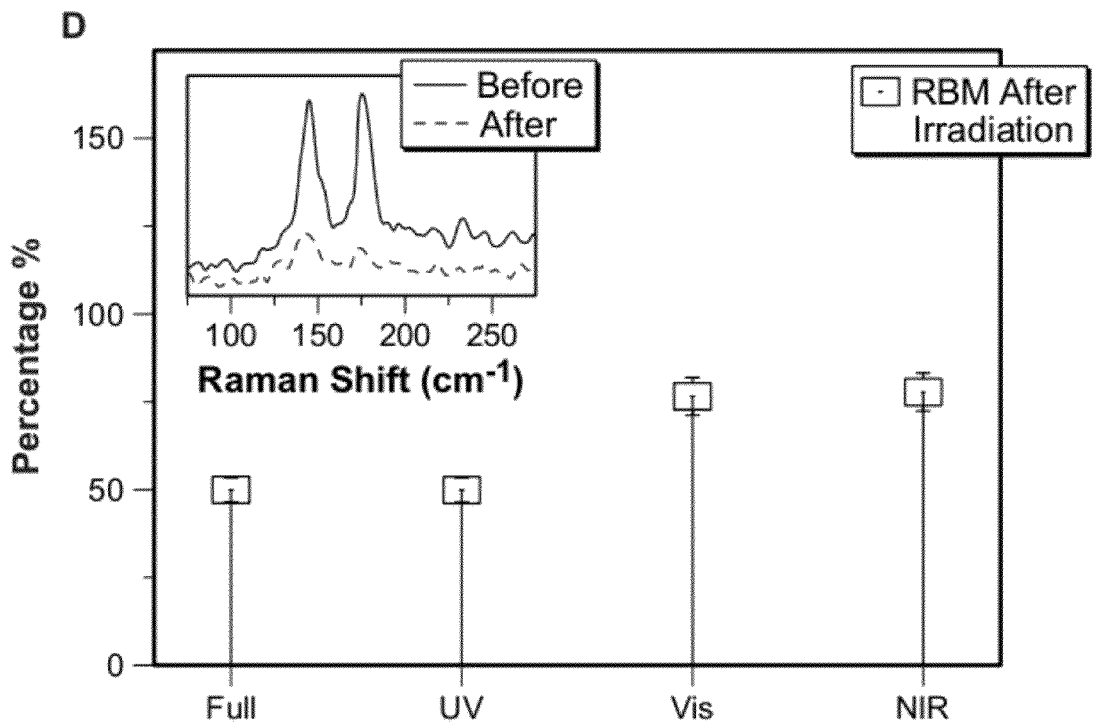
FIG. 5D shows percentage of nanotubes that remained exhibiting RBM peaks after light irradiation.

To elucidate which part of the light spectrum plays the major role in the sp$^2$/sp$^3$ conversion of carbon nanotubes, we irradiated devices with ultraviolet (250 nm-400 nm), visible (380 nm-700 nm) and near-infrared (750 nm-2000 nm) radiation for one hour by using different band-pass filters between the light source and the devices. FIG. 5C displays the Raman $I_G/I_D$ before (gray bars) and after (red bars) light exposure using the full spectrum, ultraviolet, visible and near infrared irradiation. One can clearly see that both full spectrum and ultraviolet irradiation led to a decreased $I_G/I_D$ similar in magnitude, whereas the effect of visible and near infrared irradiation is very minor and within the statistical margin of error. Further confirmation about the role of ultraviolet light is carried out by examining the Raman radial breathing mode (RBM), which is observed to be highly sensitive to light irradiation. Prolonged irradiation led to a decrease in intensity and eventual disappearance of RBM for many nanotubes (see FIG. 5D inset), which can be attributed to the presence of rehybridization defects that perturb the symmetry of this vibration mode. FIG. 5D shows the percentage of nanotubes that remained exhibiting RBM peaks after light irradiation. Again, while the full spectrum and ultraviolet irradiation delivered similar effect (40% of examined nanotubes showed disappearance of RBM bands after irradiation), the visible and near infrared irradiation delivered much less significant effect. Careful examination of FIG. 5D inset also reveals that the nanotube with diameter d=1.42 nm (174 cm$^{-1}$) displayed more significant decrease in RBM intensity than the nanotube with d=1.74 nm (144 cm$^{-1}$), indicating that small-diameter nanotubes are more reactive under ultraviolet irradiation than large-diameter nanotubes. Binding energies for carbon-carbon bonds with sp$^2$ hybridization (6.37 eV) lie well above the energy associated with photons in the UV region employed here (3.3~5.0 eV), for which the defect density increase observed upon irradiation cannot be regarded as a consequence of direct photolysis.

Figure 5E:
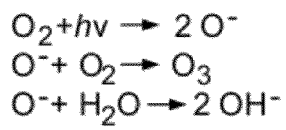
FIG. 5E shows a schematic of carbon nanotube oxidation due to light irradiation in air.
Figure 5E:
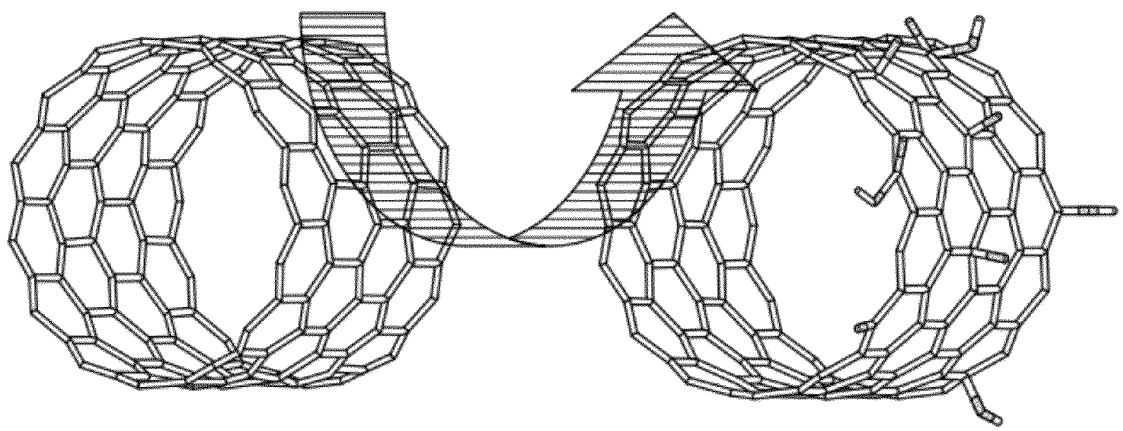
Figure 5F:
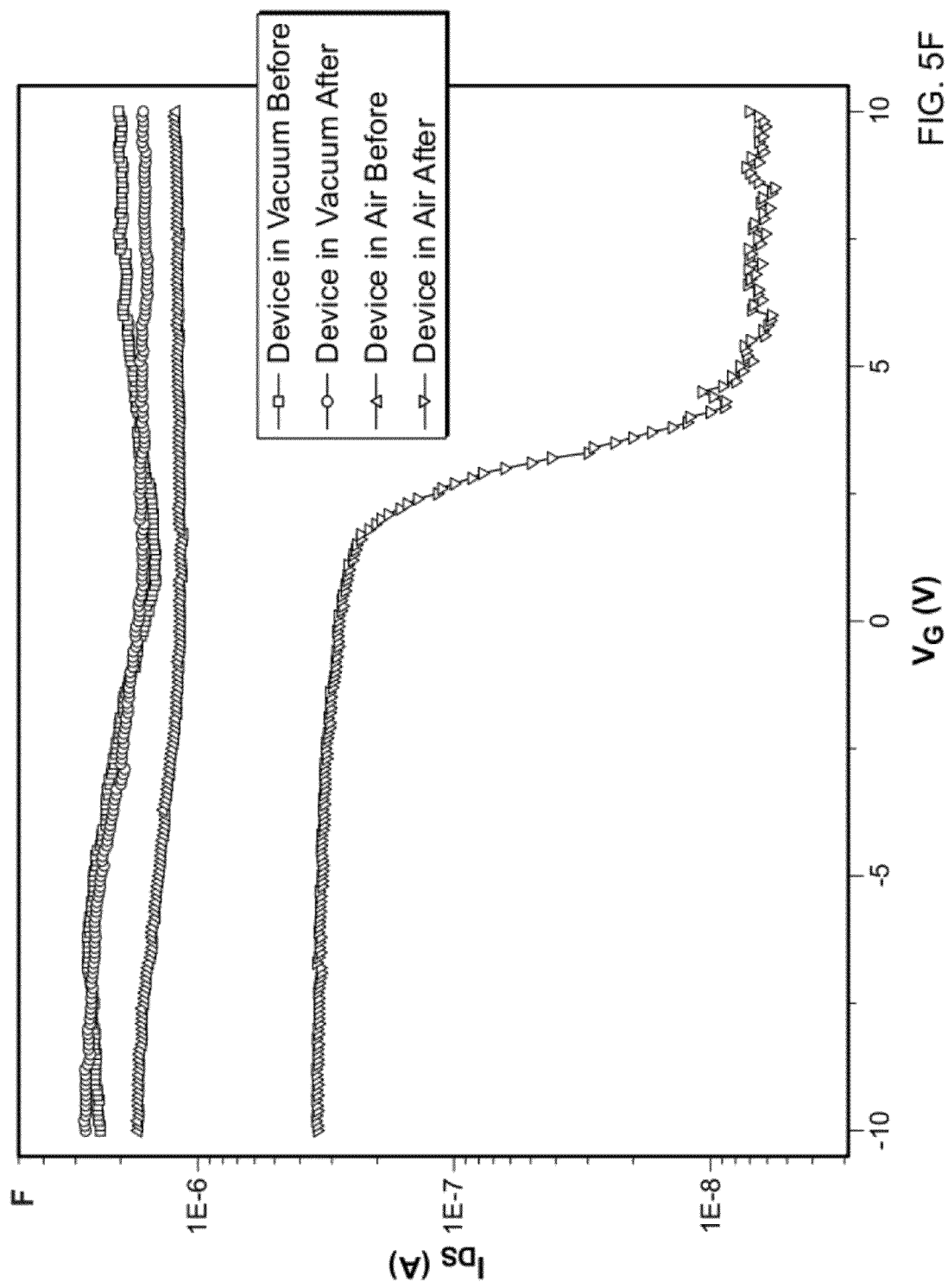
FIG. 5F shows typical examples of comparing the effects of light irradiation on nanotube transistors in air and in vacuum.

Metal-to-semiconductor conversion can be attributed to UV-assisted photochemical process of nanotubes in oxygen-containing environment. UV-irradiated oxygen forms oxygen radicals and ozone, which are strong gas-phase oxidants. FIG. 5E shows a schematic of carbon nanotube oxidation due to light irradiation in air. The radical driven reactions can be triggered by UV radiation and readily contribute to the surface functionalization of nanotubes with oxygen-containing groups. Oxidation of nanotube sidewall is also consistent with the upshift seen in the Raman G band (see FIG. 5A), which can be related to interaction between electron-withdrawing oxygen functionalities and the π-electron system on the nanotube sidewall. Further confirmation of the role of oxygen in the photo-assisted metal-to-semiconductor conversion was obtained by comparing the effects of light irradiation on nanotube transistors in air and in vacuum ($3 \times 10^{-5}$ Torr). Typical examples are shown in FIG. 5F. The device exposed to light irradiation in vacuum (black and red curves) exhibited little change in the on-state current and the $I_{On}/I_{Off}$. In contrast, the device exposed to irradiation in air (blue and green curves) displayed an increase in $I_{On}/I_{Off}$ and a drop in the on-state current. This unambiguously confirms the important role of oxygen for the light-assisted metal-to-semiconductor conversion of nanotubes.

To further elucidate the underlying mechanism and to optimize the yield of depletable transistors by light irradiation, detailed experiments can be performed on 38 working devices with single or a few nanotubes with varying irradiation time. For example, AFM can be performed to obtain the diameter of each nanotube. Light-induced metal-to-semiconductor conversion is stable and irreversible at ambient conditions, in contrast to the behavior observed by Ajayan. CNTFETs can be grouped into three categories according to their transport characteristics: i) CNTFETs that showed metallic behavior, but were converted into semiconducting and remained depletable throughout the irradiation process (see FIG. 6A, non-depletable to depletable); ii) Non-depletable CNTFETs that first became depletable, and then lost electrical conduction upon long irradiation (see FIG. 6B, non-depletable to depletable to lost); and iii) CNTFETs that were semiconducting before irradiation, and then lost electrical conduction after continued light irradiation (see FIG. 6C, depletable to lost). The CNTFET in FIG. 6A has 2 nanotubes with d=1.17 nm and 1.20 nm connecting the S/D electrodes. $I_{On}/I_{Off}$ for this device changed as 1.5→3.8→203 for 0, 3 and 5 hours of light exposure, respectively. On the other hand, the nanotube in the single-nanotube device shown in FIG. 6B has a diameter of 0.92 nm and its $I_{On}/I_{Off}$ changed as 2.4→191 for 0 and 3 hours, respectively. Radial tension possessed by small-diameter carbon nanotubes decrease their stability and increase their reactivity compared to those with larger diameters, which explains why light irradiation for the device in FIG. 6B would first make it depletable but later too resistive for charge transport. Furthermore, $I_{On}/I_{Off}$ for the single nanotube CNTFET in FIG. 6C (d=1.1 nm) changes as 21→35→846 upon light irradiation for 0 and 3 hours, respectively. Comparison between FIG. 6A and FIG. 6B confirms that small-diameter nanotubes are more reactive, as electrical conduction is lost in FIG. 6B, but persists in FIG. 6A after 5 hour exposure.

Figure 6A:
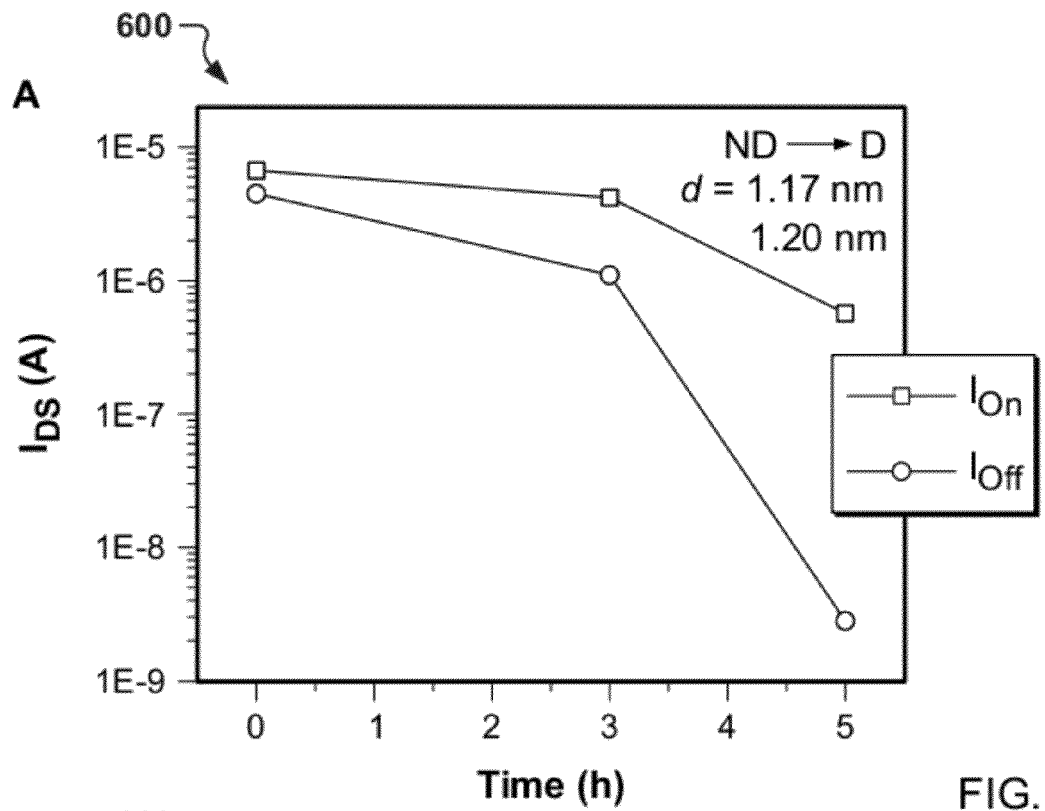
FIGS. 6A, 6B, 6C, 6D, and 6E show the influence of the irradiation time and nanotube diameter on the metal-to-semiconductor conversion observed in CNTFETs.
Figure 6B:
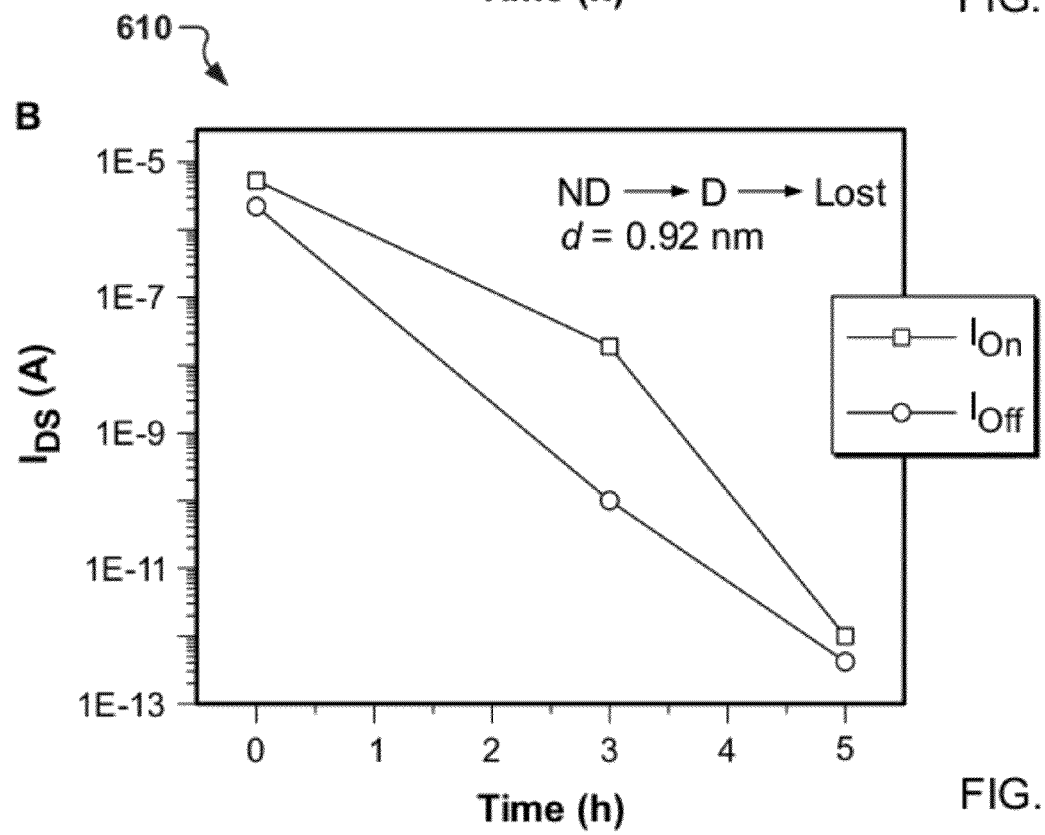
Figure 6C:
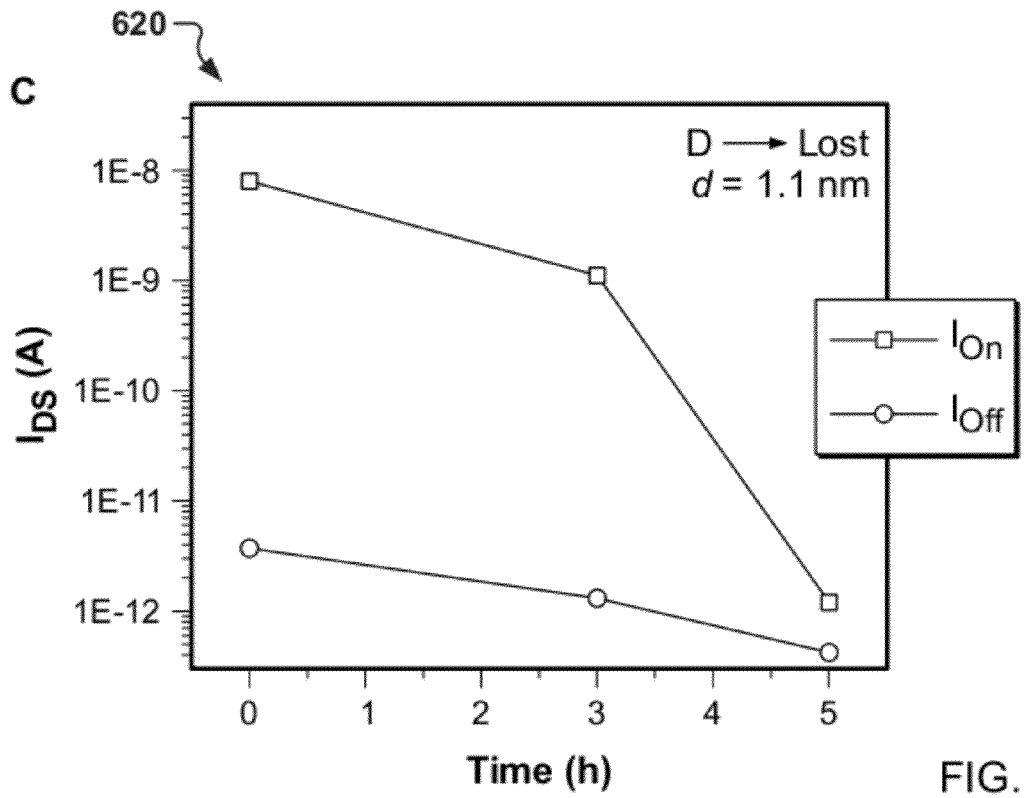
Figure 6D:
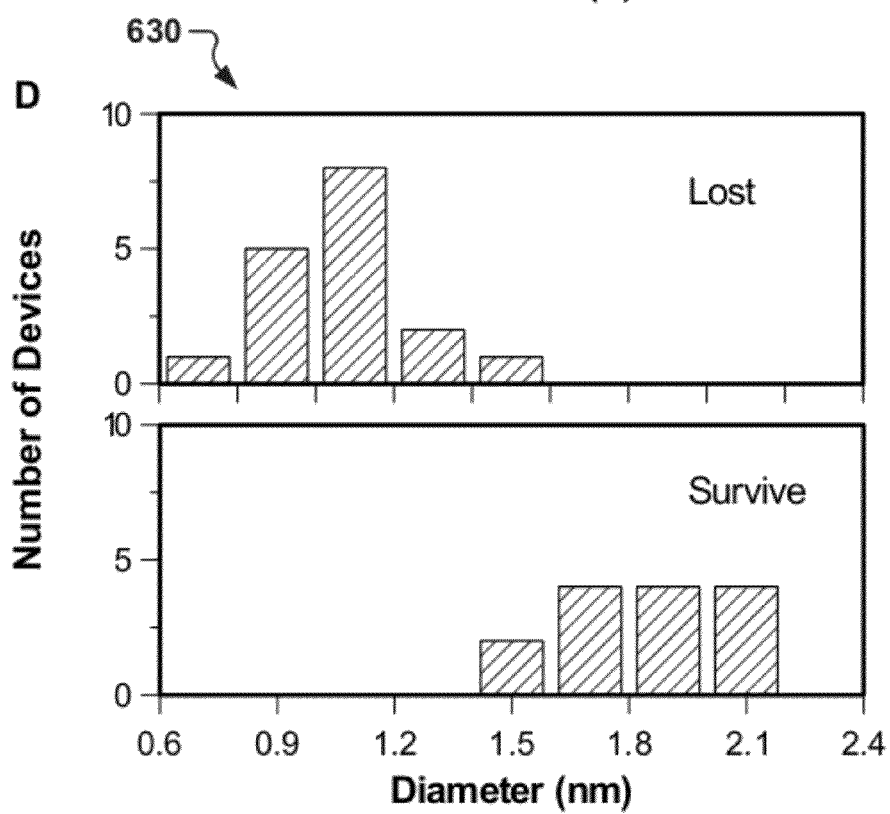
Figure 6E:
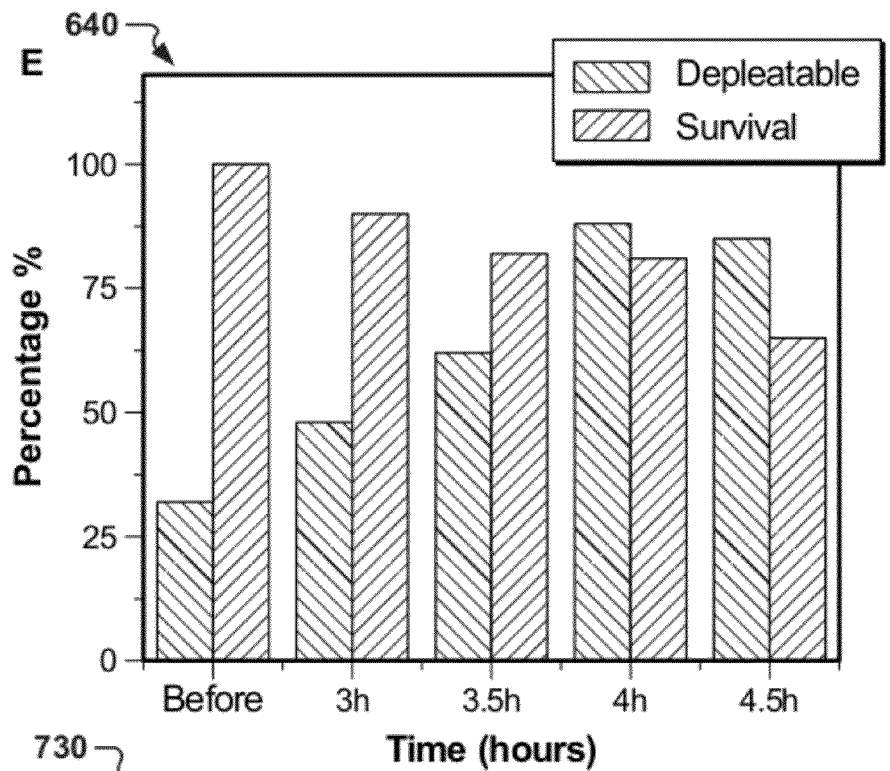

FIGS. 6A, 6B, 6C, 6D, and 6E show the influence of the irradiation time and nanotube diameter on the metal-to-semiconductor conversion observed in CNTFETs. FIGS. 6A, 6B and 6C are various data charts 600, 610 and 620 that shows $I_{On}$ and $I_{Off}$ of single- and few-nanotube CNTFETs showing different evolutions under timed light irradiation (Vds=100 mV). FIG. 6D is a graph 630 that shows a histogram of CNTFETs that lost electrical conduction or survived after five-hour light irradiation plotted versus the nanotube diameter. Clear diameter dependence was observed. FIG. 6E is a chart 640 that shows the percentage of CNTFETs that survived (red) and showed depletable behavior (black) for different light irradiation durations. The best yield was found after 4-hour exposure, when the percentage of depletable devices increased from 32% to 88% while keeping a survival ratio near 81%.

The effect of five-hour light exposure on a chip with 38 working CNTFETs is shown in FIG. 6D. Devices with nanotube diameters ranging from 0.6 nm to ~1.3 nm became nearly open circuits, while those with nanotube diameters larger than 1.4 nm in general survived light exposure. After 5 hours of irradiation, most (90%) of the surviving devices (20 CNTFETs) were depletable and exhibited clear semiconducting behavior. Similar diameter dependence has also been observed for nanotube devices exposed to $H_2$ plasma and $CH_4$ plasma due to the higher curvature of small-diameter nanotubes that makes them more reactive than their large-diameter counterparts. As demonstrated above, prolonged light-assisted oxidation of the nanotube sidewall may lead to highly resistive devices. Thus, it is important to find the exposure time that best optimize the trade-off between depletable and surviving devices. FIG. 6E shows the change in the percentage of depletable (black) and surviving (red) CNTFETs from a chip with 31 working devices, as a function of light exposure time with a power density of 2.2 W/cm². The best yield was obtained after 4 hours of light exposure, which offered ~88% depletable devices and a survival rate of ~81%.

Figure 7B:
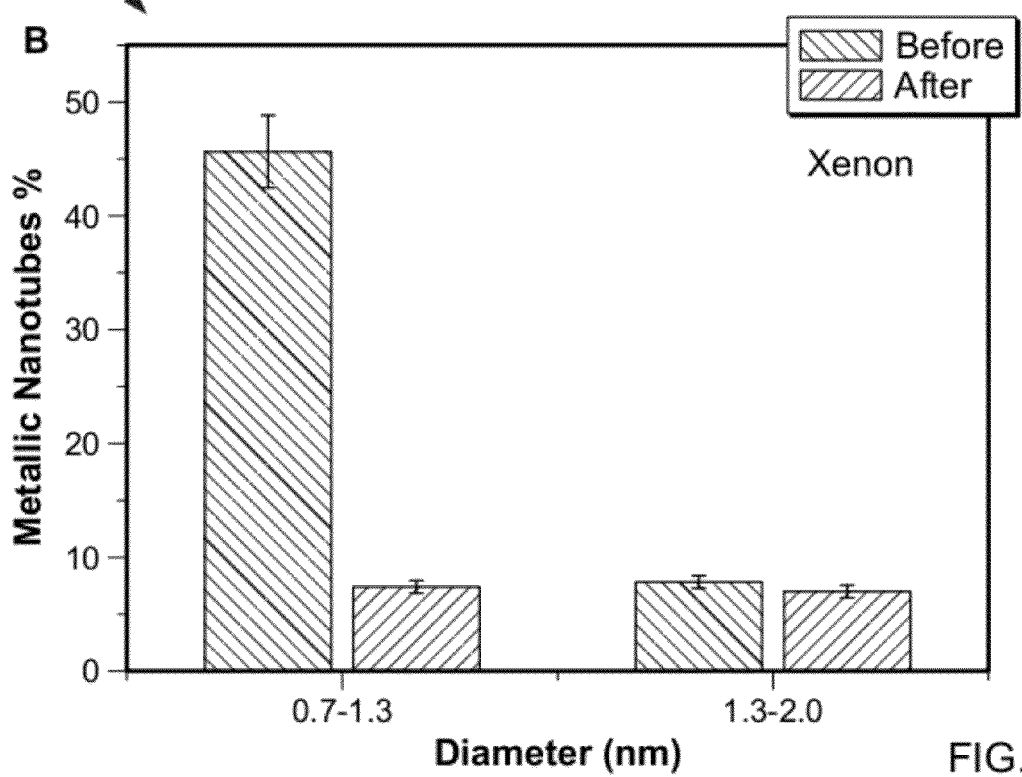
FIG. 7B shows the percentage of metallic nanotubes in the samples, before and after irradiation.
Figure 7A:
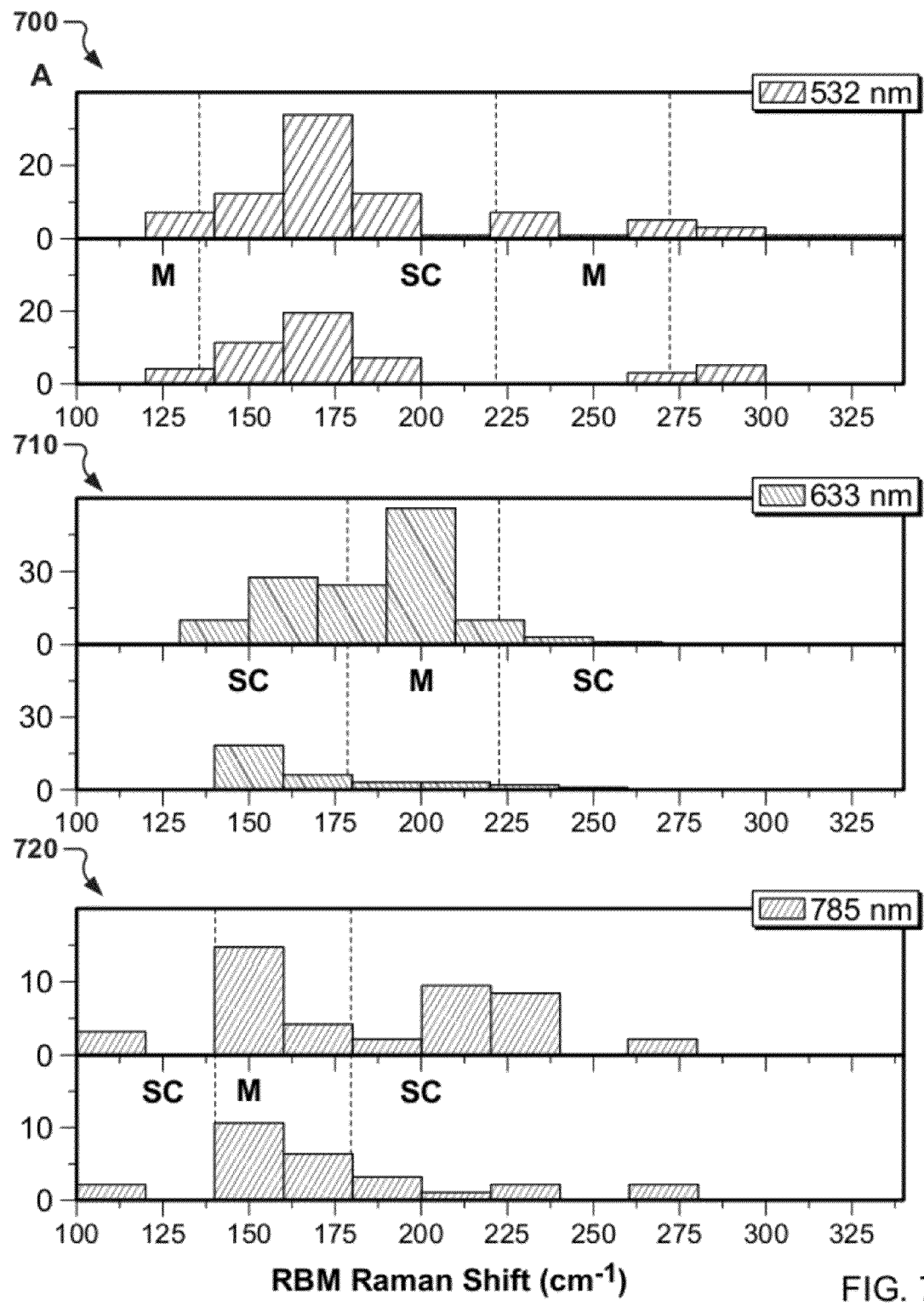
FIG. 7A includes stacked histograms showing the number of nanotubes exhibiting RBM v.s. the RBM frequency, before and after light irradiation, as measured with three excitation lines (532 nm, 633 nm, and 785 nm).
Figures 8C, 8D:
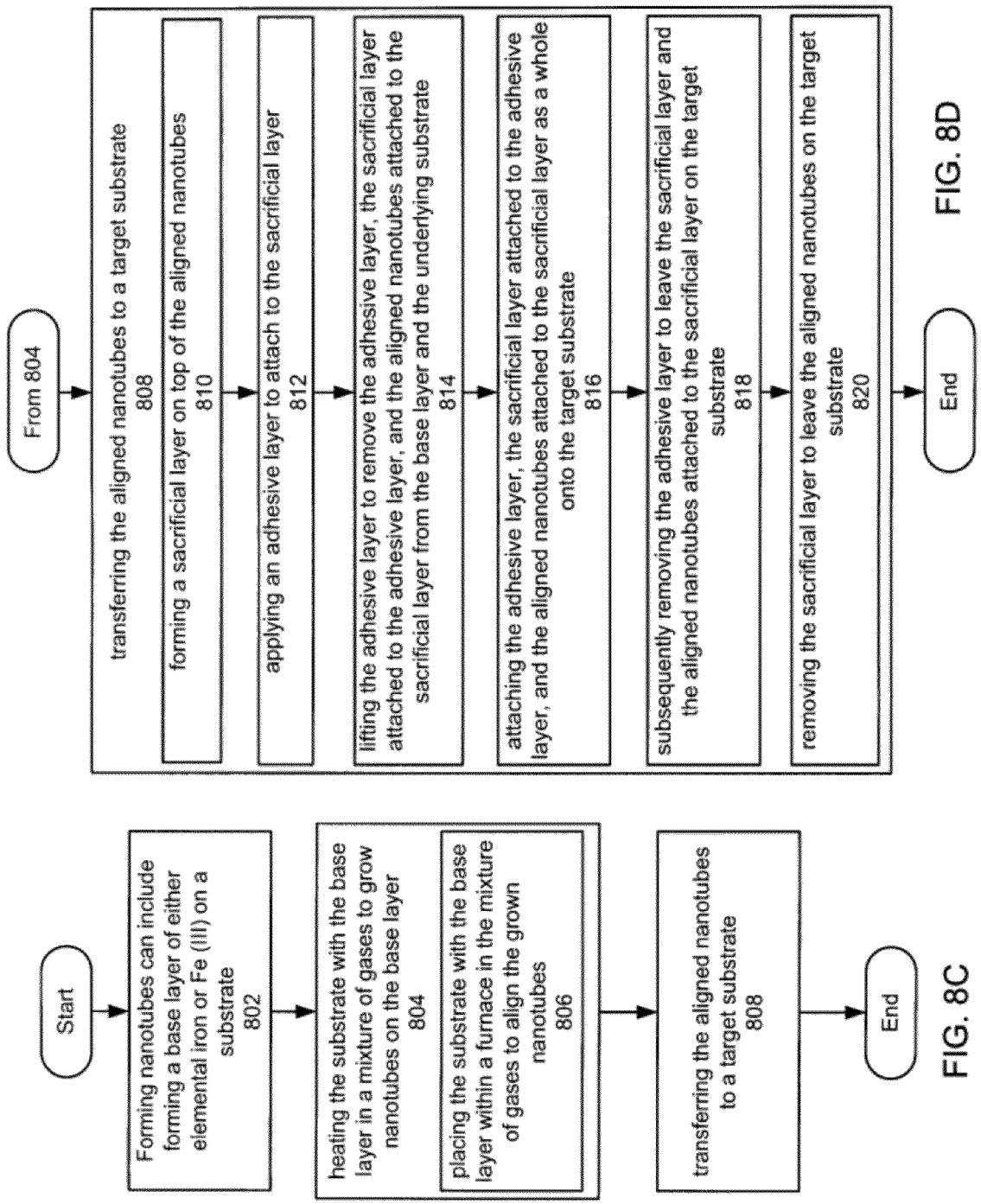
Figure 8E:
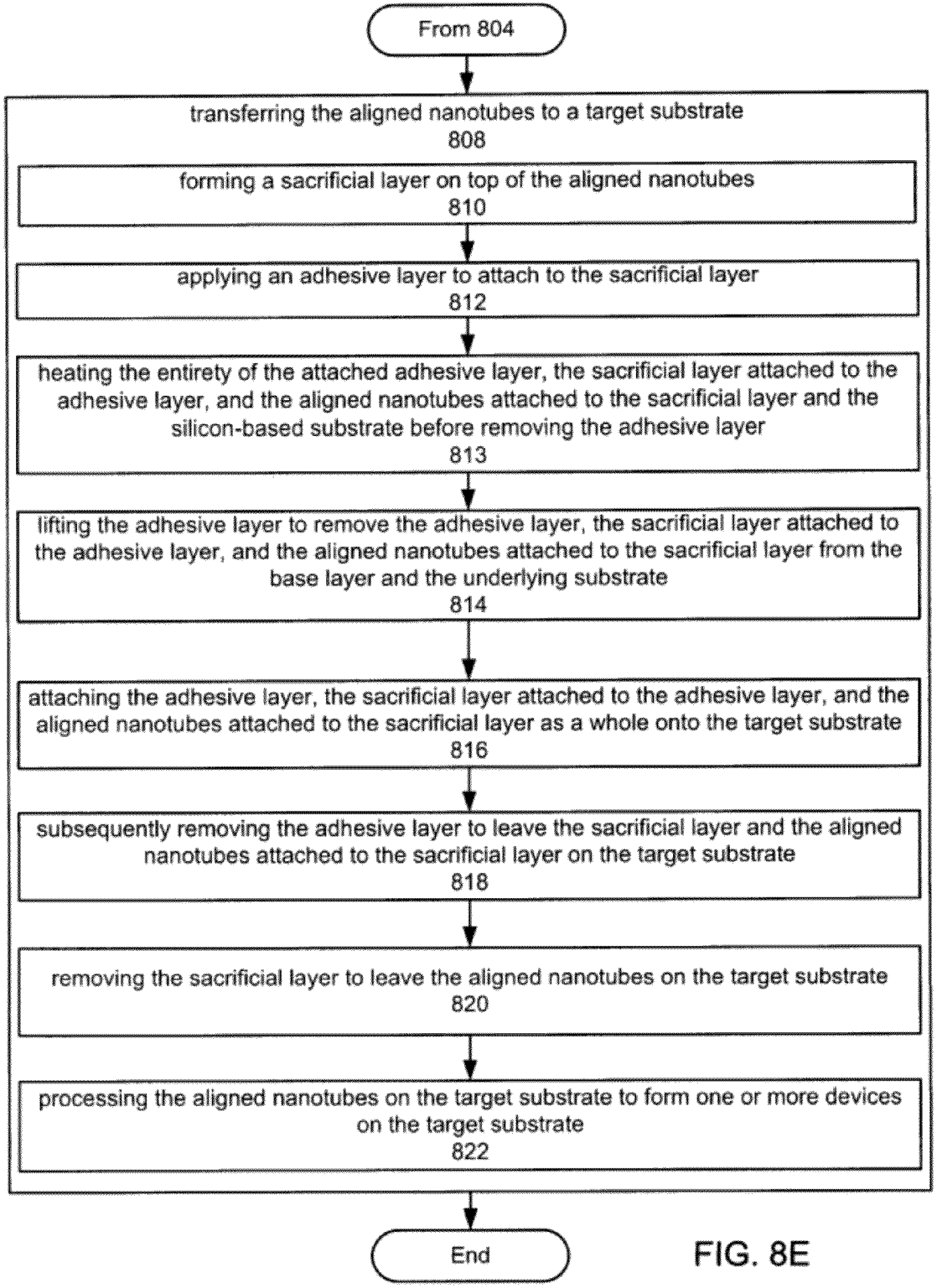

Once the diameter dependence has been elucidated, micro Raman measurements can be performed to ascertain whether light irradiation provides selectivity between metal and semiconductor tubes of similar diameters (see FIGS. 7A and 7B). FIG. 7A includes stacked histograms 700, 710 and 720 showing the number of nanotubes exhibiting RBM v.s. the RBM frequency, before and after light irradiation, as measured with three excitation lines (532 nm, 633 nm, and 785 nm). Frequency regions characteristic for metal or semiconductor nanotubes are highlighted based on Kataura's plot (Ref). Comparison of the histograms obtained before and after irradiation for each laser shows a predominant light-induced oxidation of small-diameter nanotubes (large RBM frequency). FIG. 7B is a chart 730 showing the percentage of metallic nanotubes in as-grown samples before (gray columns) and after (red columns) light exposure using xenon (upper panel) and halogen (lower panel) lamps. Nanotubes can be grouped into two categories based on their diameter: small-diameter (0.7-1.3 nm) and large-diameter (1.4-2.0 nm) nanotubes. A substantial decrease in the percentage of small-diameter metallic nanotubes found after light irradiation, for both light sources employed, indicates their preferential oxidation over semiconducting small-diameter nanotubes. Contrarily, the percentage of large-diameter metallic nanotubes was largely unaffected by light, indicating the preferential oxidation (metal over semiconductor) is more effective for small-diameter nanotubes.

Covalent functionalization of SWNT sidewall is accompanied by a decrease in the RBM intensity below the noise level (disappearance of RBM bands). For complete characterization, micro Raman spectroscopy can be performed with three different excitation lines (532 nm, 633 nm, and 785 nm). FIG. 7A shows plots of the number of nanotubes exhibiting RBM v.s. the RBM frequency before and after irradiation as measured with all three excitation lines. The frequencies characteristic for metal and semiconductor nanotubes are highlighted based on Kataura's plot (Ref). Detailed analysis of the data shown in FIG. 7A reveals a diameter-dependent increase in the $sp^3$ character of nanotubes upon light irradiation for all lasers employed. By comparing the histograms in FIG. 7A before and after light irradiation, one can clearly see that predominantly small-diameter nanotubes (with large RBM frequency) underwent disappearance of RBM bands, which is consistent with the diameter dependence shown in FIGS. 6A-6E. Interestingly, most metallic nanotubes with $M_{11}$ bandgaps in resonance with visible laser wavelengths 532 nm (2.32 eV) and 633 nm (1.96 eV) have diameters lower than ~1.3 nm, so they are easily oxidized by light irradiation. NIR laser energy with wavelength of 785 nm (1.58 eV) is, in contrast, in good resonance with $S_{11}$ and $S_{22}$ bandgaps of semiconducting nanotubes with diameters lower than 1.3-1.4 nm, and metallic nanotubes with larger diameters. FIG. 7A confirms that for all lasers employed, there is a strong diameter-dependent oxidation of nanotubes.

One can irradiate as-grown nanotubes with the full spectrum of xenon and halogen light sources. FIG. 7B shows the percentage of metallic nanotubes in the samples, before and after irradiation. Nanotubes were grouped into two categories based on their diameter (0.7-1.3 nm and 1.4-2.0 nm). Importantly, it can be noted that for both light sources, a marked preferential oxidation of metallic nanotubes with diameters between 0.7 and 1.3 nm over their semiconducting counterparts, with a decrease in the percentage of metallic nanotubes from 45 to 7% and 35 to 18% for xenon and halogen irradiation, respectively. The difference observed in the effect of xenon and halogen light sources over the oxidation of small-diameter nanotubes can be related to the higher intensity of UV photons of the former. On the other hand, there was no significant difference between the oxidation of large-diameter metallic and semiconducting nanotubes in the diameter range of 1.4-2.0 nm. These results indicate that a higher radial tension, added to the presence of free electrons on the conduction band of small-diameter metallic nanotubes makes them react at a faster rate, upon light-induced oxidation, than semiconducting nanotubes of similar diameters.

Light irradiation of nanotubes constitutes a breakthrough scalable process for nanotube-based electronic devices via a defect-assisted metal-to-semiconductor conversion stimulated by light-induced oxidation. This process was found to be diameter dependent and faster in small-diameter metallic nanotubes. $I_{on}/I_{off}$ improvements obtained in CNTFETs were typically in the range of $10^2$ up to $10^5$ and can be easily scaled and integrated as a customizable technology over larger-diameter wafers. The approach presented in this work offers clear advantages over conventional processes to eliminate metallic nanotubes from CNTFETs and constitutes a significant advance towards large scale fabrication of carbon nanotube based electronic devices.

FIGS. 8A, 8B, 8C, 8D, and 8E are flow charts showing an exemplary process 800 for forming nanotubes. Forming nanotubes can include forming a base layer of either elemental iron or Fe (III) on a substrate (802). Additionally, forming nanotubes can include heating the substrate with the base layer in a mixture of gases to grow nanotubes on the base layer (804).

The substrate can be made of sapphire or quartz. The mixture can include $H_2$, $CH_4$, and $C_2H_4$. Heating the substrate with the base layer can include placing the substrate with the base layer within a furnace in the mixture of gases to align the grown nanotubes (806). The method can include transferring the aligned nanotubes to a target substrate (808). Transferring the aligned nanotubes can include forming a sacrificial layer on top of the aligned nanotubes (810); applying an adhesive layer to attach to the sacrificial layer (812); lifting the adhesive layer to remove the adhesive layer, the sacrificial layer attached to the adhesive layer, and the aligned nanotubes attached to the sacrificial layer from the base layer and the underlying substrate (814); attaching the adhesive layer, the sacrificial layer attached to the adhesive layer, and the aligned nanotubes attached to the sacrificial layer as a whole onto the target substrate (816); subsequently removing the adhesive layer to leave the sacrificial layer and the aligned nanotubes attached to the sacrificial layer on the target substrate (818); and removing the sacrificial layer to leave the aligned nanotubes on the target substrate (820). The sacrificial layer can include a metal layer. The metal layer can include a gold film. The Au film can be removed by using a gold etchant to dissolve the gold film while leaving the aligned nanotubes on the target substrate. The adhesive layer can include a thermally activated adhesive polymer layer. The method can include heating the entirety of the attached adhesive layer, the sacrificial layer attached to the adhesive layer, and the aligned nanotubes attached to the sacrificial layer and the silicon-based substrate before removing the adhesive layer (813). The method can include processing the aligned nanotubes on the target substrate to form one or more devices on the target substrate (822). The target substrate can include a silicon-based substrate; and the processing can include CMOS processing. The one or more devices can include CMOS field-effect transistors. The processing can include exposing the nanotubes on the target substrate to a radiation to effectuate a metal-to-semiconductor conversion in the exposed nanotubes.

FIGS. 9A and 9B are flow charts showing an exemplary process 900 for forming a semiconductor device from nanotubes. The method includes forming nanotubes on a substrate (902). The method includes patterning the nanotubes on the substrate to form one or more structures for one or more semiconductor devices (904), as shown in FIG. 1B. The method includes transferring the formed nanotubes to a target substrate (906); and exposing the nanotubes on the target substrate to a radiation to effectuate a metal-to-semiconductor conversion in the exposed nanotubes (908).

Implementations can optionally include one or more of the following features. The method can include forming an electrode layer over the nanotubes. Forming the nanotubes on the substrate can include forming the nanotubes on a sapphire or quartz wafer. Transferring the formed nanotubes to the target substrate can include transferring the formed nanotubes to a silicon wafer. The radiation can include at least one of full spectrum light or ultraviolet light. Exposing the nanotubes can include exposing the nanotubes on the target substrate to a radiation in oxygen to effectuate a metal-to-semiconductor conversion in the exposed nanotubes. Forming nanotubes can include forming small-diameter nanotubes having a diameter size in a range of 0.7-1.3 nm. Exposing the nanotubes can include exposing the nanotubes to the radiation for a period of time based on a diameter size of the nanotubes.

The described techniques, apparatus and systems for using light irradiation to induce the metal-to-semiconductor conversion of carbon nanotubes can potentially provide one or more of the following advantages. For example, the described techniques can use light irradiation to induce the metal-to-semiconductor conversion of carbon nanotubes for transistors based on aligned nanotubes and individual nanotube devices. The conversion process can be easy to implement and scalable to complete wafers. Additionally, the described metal-to-semiconductor conversion of carbon nanotubes can be used for fabricating field-effect transistors based on both aligned nanotubes and individual nanotube devices. The conversion process is induced by light irradiation, scalable to wafer-size scales and capable of yielding improvements in the channel-current on/off ratio up to five orders of magnitude in nanotube-based field-effect transistors. Inactivation of metallic nanotubes in the channels can be achieved as a consequence of a photochemical process that led to a controlled oxidation of the nanotube sidewall, and hence stronger localization of π-electrons. This process can be extended to other carbon nanomaterials such as graphene and can find applications beyond nanoelectronics, in any field where a clean and scalable oxidation process of carbon nanomaterials is needed.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A method for forming nanotubes, comprising:
   forming a base layer of a transition metal on a substrate; and
   heating the substrate with the base layer in a mixture of gases to grow nanotubes on the formed base layer, wherein the nanotubes comprise aligned nanotubes; and
   transferring the aligned nanotubes to a target substrate, wherein transferring the aligned nanotubes comprises:
   forming a sacrificial layer on top of the aligned nanotubes;
   applying an adhesive layer to attach to the sacrificial layer;
   lifting the adhesive layer to remove the adhesive layer, the sacrificial layer attached to the adhesive layer, and the aligned nanotubes attached to the sacrificial layer from the base layer and the underlying substrate;
   attaching the adhesive layer, the sacrificial layer attached to the adhesive layer, and the aligned nanotubes attached to the sacrificial layer as a whole onto the target substrate;
   subsequently removing the adhesive layer to leave the sacrificial layer and the aligned nanotubes attached to the sacrificial layer on the target substrate; and
   removing the sacrificial layer to leave the aligned nanotubes on the target substrate.

2. The method as in claim 1, wherein:
   the mixture includes $H_2$, $CH_4$, and $C_2H_4$.

3. The method as in claim 1, wherein heating the substrate with the base layer comprises:
   placing the substrate with the base layer within a furnace in the mixture of gases to align the grown nanotubes.

4. The method as in claim 1, wherein:
   the substrate is made of crystal structure that promotes alignment of the nanotubes.

5. The method as in claim 4, wherein the crystal structure that promotes alignment of the nanotubes comprises sapphire or quartz.

6. The method as in claim 1, wherein:
   the sacrificial layer comprises a metal layer.

7. The method as in claim 6, wherein:
   the metal layer comprises a gold film.

8. The method as in claim 7, wherein:
   the gold film is removed by using a gold etchant to dissolve the gold film while leaving the aligned nanotubes on the target substrate.

9. The method as in claim 1, wherein:
   the adhesive layer is a thermally activated adhesive polymer layer.

10. The method as in claim 9, comprising:
    heating the entirety of the attached adhesive layer, the sacrificial layer attached to the adhesive layer, and the aligned nanotubes attached to the sacrificial layer and the silicon-based substrate before removing the adhesive layer.

11. The method as in claim 1, comprising:
    processing the aligned nanotubes on the target substrate to form one or more devices on the target substrate.

12. The method as in claim 11, wherein:
    the target substrate comprises a silicon-based substrate; and
    the processing comprises CMOS processing.

13. The method as in claim 12, wherein:
    the one or more devices comprises CMOS field-effect transistors.

14. The method as in claim 12, wherein:
    the processing comprises exposing the nanotubes on the target substrate to a radiation to effectuate a metal-to-semiconductor conversion in the exposed nanotubes.

15. The method as in claim 1, wherein the transition metal comprises at least one of iron, cobalt, nickel, copper or gold.

16. A method for forming a semiconductor device from nanotubes, the method comprising:
    forming aligned nanotubes on a substrate;
    patterning the aligned nanotubes on the substrate to form one or more structures for one or more semiconductor devices;
    transferring the patterned aligned nanotubes to a target substrate; and
    exposing the aligned nanotubes on the target substrate to a radiation to effectuate a metal-to-semiconductor conversion in the exposed aligned nanotubes.

17. The method as in claim 16, comprising:
    forming an electrode layer over the aligned nanotubes.

18. The method as in claim 1, wherein forming the aligned nanotubes on the substrate comprises forming the aligned nanotubes on crystal material that promotes alignment of aligned nanotubes.

19. The method as in claim 18, wherein the crystal material that promotes alignment of aligned nanotubes comprises a sapphire wafer or a quartz wafer.

20. The method as in claim 16, wherein transferring the formed aligned nanotubes to the target substrate comprises:
    transferring the formed aligned nanotubes to a silicon wafer.

21. The method as in claim 16, wherein the radiation comprises:
    at least one of full spectrum light or ultraviolet light.

22. The method as in claim 16, wherein exposing the aligned nanotubes comprises:
    exposing the aligned nanotubes on the target substrate to a radiation in oxygen to effectuate a metal-to-semiconductor conversion in the exposed aligned nanotubes.

23. The method as in claim 16, wherein forming aligned nanotubes comprises forming small-diameter aligned nanotubes having a diameter size in a range of 0.7-1.3 nm.

24. The method as in claim 16, wherein exposing the aligned nanotubes comprises exposing the aligned nanotubes to the radiation for a period of time based on a diameter size of the aligned nanotubes.

25. The method as in claim 16, wherein forming aligned nanotubes on a substrate comprises:

forming a base layer comprising a transition metal over a substrate that promotes alignment of nanotubes;

growing aligned nanotubes over the formed base layer in presence of a gaseous mixture.

26. The method as in claim 25, wherein the transition metal comprises at least one of iron, cobalt, nickel, copper or gold.

27. The method as in claim 25, wherein the substrate that promotes alignment of the nanotubes comprises sapphire or quartz.

* * * * *

UNITED STATES PATENT AND TRADEMARK OFFICE
CERTIFICATE OF CORRECTION

| | | |
|---|---|---|
| PATENT NO. | : 8,324,087 B2 | Page 1 of 1 |
| APPLICATION NO. | : 12/728179 | |
| DATED | : December 4, 2012 | |
| INVENTOR(S) | : Zhou et al. | |

It is certified that error appears in the above-identified patent and that said Letters Patent is hereby corrected as shown below:

In the Claim

Column 12, line 41 in Claim 18, delete "claim 1," and insert -- claim 16, --, therefor.

Signed and Sealed this
Fourth Day of March, 2014

Michelle K. Lee
*Deputy Director of the United States Patent and Trademark Office*